(12) United States Patent
Forseth et al.

(10) Patent No.: US 11,535,927 B2
(45) Date of Patent: *Dec. 27, 2022

(54) MULTI-CHAMBER DEPOSITION EQUIPMENT FOR SOLID FREE FORM FABRICATION

(71) Applicant: Norsk Titanium AS, Honefoss (NO)

(72) Inventors: Trond Forseth, Ringerike (NO); Brede Vigdal, Tyristrand (NO); Arne Ramsland, Hole (NO); Svein Steinsvik, Hole (NO); Jorgen Haugen, Hole (NO)

(73) Assignee: Norsk Titanium AS, Honefoss (NO)

( * ) Notice: Subject to any disclaimer, the term of this patent is extended or adjusted under 35 U.S.C. 154(b) by 0 days.

This patent is subject to a terminal disclaimer.

(21) Appl. No.: 17/245,877

(22) Filed: Apr. 30, 2021

(65) Prior Publication Data

US 2021/0246541 A1 Aug. 12, 2021

Related U.S. Application Data

(60) Continuation of application No. 16/927,164, filed on Jul. 13, 2020, now Pat. No. 11,001,920, which is a
(Continued)

(51) Int. Cl.
*C23C 14/24* (2006.01)
*B22F 10/20* (2021.01)
(Continued)

(52) U.S. Cl.
CPC .............. *C23C 14/24* (2013.01); *B22F 10/00* (2021.01); *B22F 10/20* (2021.01); *C23C 14/50* (2013.01); *B22F 10/10* (2021.01); *B22F 10/30* (2021.01); *B22F 2201/10* (2013.01); *B22F 2201/20* (2013.01); *Y02P 10/25* (2015.11)

(58) Field of Classification Search
None
See application file for complete search history.

(56) References Cited

U.S. PATENT DOCUMENTS 4,328,257 A 5/1982 Muehlberger et al.
5,578,227 A 11/1996 Rabinovich
(Continued)

FOREIGN PATENT DOCUMENTS

CN 202558931 U 11/2012
CN 103552241 A 2/2014
(Continued)

OTHER PUBLICATIONS

Chinese Office Action dated Nov. 2, 2020 for Chinese Patent Application No. 201780042213.2, a counterpart foreign application of U.S. Pat. No. 10,738,378, 18 pages.
(Continued)

*Primary Examiner* — Joel G Horning
(74) *Attorney, Agent, or Firm* — Lee & Hayes, P.C.

(57) ABSTRACT

Provided is a chamber system for solid free form fabrication, the chamber system having a deposition chamber, a service chamber and one or more loading/unloading chambers. The chamber system allows for a more efficient and cost effective process to service the deposition apparatus, load holding substrates, and unload workpieces without requiring having to adjust the atmosphere in the deposition chamber.

21 Claims, 5 Drawing Sheets

Related U.S. Application Data division of application No. 15/206,163, filed on Jul. 8, 2016, now Pat. No. 10,738,378.

(51) Int. Cl.
    *B22F 10/00*     (2021.01)
    *C23C 14/50*     (2006.01)
    *B22F 10/30*     (2021.01)
    *B22F 10/10*     (2021.01)

(56) References Cited

U.S. PATENT DOCUMENTS

| | | |
|---|---|---|
| 6,626,228 B1 | 9/2003 | Bewlay et al. |
| 2002/0139780 A1 | 10/2002 | Jones et al. |
| 2005/0173380 A1 | 8/2005 | Carbone |
| 2006/0185473 A1 | 8/2006 | Withers et al. |
| 2007/0052543 A1 | 3/2007 | Albarado |
| 2010/0193480 A1 | 8/2010 | Adams |
| 2010/0305742 A1 | 12/2010 | Twelves, Jr. et al. |
| 2015/0069668 A1 | 3/2015 | Mironets et al. |
| 2015/0077158 A1 | 3/2015 | Teig et al. |
| 2015/0141234 A1 | 5/2015 | Sander et al. |
| 2015/0177158 A1 | 6/2015 | Cheverton |
| 2016/0067780 A1 | 3/2016 | Zediker |
| 2016/0243618 A1 | 8/2016 | Heugel et al. |

FOREIGN PATENT DOCUMENTS

| | | |
|---|---|---|
| CN | 104066935 A | 9/2014 |
| CN | 204296032 U | 4/2015 |
| CN | 204770668 U | 11/2015 |
| CN | 108972006 A | 12/2018 |
| DE | 102004057866 A1 | 6/2006 |
| DE | 102013223411 A1 | 5/2015 |
| JP | H0758093 A | 3/1995 |
| JP | 2013501627 A | 8/2010 |
| KR | 20120068865 A | 6/2012 |
| WO | 2006133034 A1 | 12/2006 |
| WO | 2009068843 A1 | 6/2009 |
| WO | 2011019287 A2 | 8/2010 |
| WO | 2016044837 A1 | 9/2015 |

OTHER PUBLICATIONS

Korean Office Action dated Feb. 23, 2021 for Korean Patent Application No. 10-2019-7000549, 6 pages.

Taminger et al., "Electron Beam Freeform Fabrication for Cost Ellective Near-Net Shape Manufacturing", NATO/RTOACT-139 Specialests' Meeting on Cost Effective Manufacture via Net Shape Processing, Amersterdam, the Netherlands, 2006, pp. 1-9.

Japanese Office Action dated Jan. 4, 2022 for Japanese Patent Application No. 2019-500573, a foreign counterpart to U.S. Pat. No. 10,738,378, 4 pages.

Translation of JP Office Action from Corresponding JP Application No. 2019-500573 dated Apr. 28, 2021, a counterpart foreign application for U.S. Appl. No. 15/206,163, 5 pages.

MULTI-CHAMBER DEPOSITION EQUIPMENT FOR SOLID FREE FORM FABRICATION

This patent application is a continuation of and claims priority to co-pending and co-owned U.S. patent application Ser. No. 16/927,164, filed Jul. 13, 2020, entitled "MULTI-CHAMBER DEPOSITION EQUIPMENT FOR SOLID FREE FORM FABRICATION," now U.S. Pat. No. 11,001,920, issued May 11, 2021, which is a divisional of U.S. patent application Ser. No. 15/206,163, filed Jul. 8, 2016, entitled MULTI-CHAMBER DEPOSITION EQUIPMENT FOR SOLID FREE FORM FABRICATION, now U.S. Pat. No. 10,738,378, issued Aug. 11, 2020, both of which are hereby incorporated in their entirety by reference herein.

FIELD OF THE INVENTION

The present invention relates to a method and arrangement for manufacturing objects by solid freeform fabrication, especially titanium and titanium alloy objects.

BACKGROUND OF THE INVENTION

Metal parts having precise dimensional tolerances can be made of titanium or titanium alloys are conventionally made by casting, forging or machining from a billet. These techniques can require large lead times or high material use of the expensive titanium metal, or both, in the fabrication of the metal part.

Fully dense physical objects may be made by a manufacturing technology known as rapid prototyping, rapid manufacturing, layered manufacturing, solid freeform fabrication (SFFF), additive fabrication, additive manufacturing and 3D printing. This technique employs computer aided design (CAD) software to first construct a virtual model of the object which is to be made, and then transform the virtual model into thin parallel slices or layers, usually horizontally oriented. The physical object can then be made by laying down successive layers of raw material in the form of liquid, paste, powder or other layerable, spreadable or fluid form, such as melted metal, e.g., from a melted welding wire, or preformed as sheet material resembling the shape of the virtual layers until the entire object is formed. The layers can be fused together to form a solid dense object.

Solid freeform fabrication is a flexible layered manufacturing technique allowing creation of objects of almost any shape at relatively fast production rates, typically varying from some minutes to several days for each object. The technique is thus suited for formation of prototypes and small production series, and can be scaled up for mass production.

The technique of layered manufacturing can be expanded to include deposition of pieces of the construction material, that is, each structural layer of the virtual model of the object is divided into a set of pieces which when laid side by side form the layer. This allows forming metallic objects by welding a wire onto a substrate in successive stripes forming each layer according to the virtual layered model of the object, and repeating the process for each layer until the entire physical object is formed. The accuracy of the welding technique is usually too coarse to allow directly forming the object with acceptable dimensions. The formed object will thus usually be considered a green object or pre-form which needs to be machined to acceptable dimensional accuracy.

Taminger and Hafley ("Electron Beam Freeform Fabrication for Cost Effective Near-Net Shape Manufacturing", NATO/RTOAVT-139 Specialists' Meeting on Cost Effective Manufacture via Net Shape Processing (Amsterdam, the Netherlands, 2006) (NATO), pp. 9-25) discloses a method and device for manufacturing structural metal parts directly from computer aided design data combined with electron beam freeform fabrication (EBF). The structural part is built by welding on successive layers of a metallic welding wire which is welded by the heat energy provided by the electron beam. The EBF process involves melting a metal wire into a molten pool made and sustained by a focused electron beam in a high vacuum environment. The positioning of the electron beam and welding wire is obtained by having the electron beam gun and the actuator supporting the substrate movably hinged along one or more axis (X, Y, Z, and rotation) and regulate the position of the electron beam gun and the support substrate by a four axis motion control system. The process is reported to be nearly 100% efficient in material use and 95% effective in power usage. The method can be employed both for bulk metal deposition and finer detailed depositions, and the method is claimed to obtain significant effect on lead time reduction and lower material and machining costs as compared to the conventional approach of machining the metal parts. The electron beam technology has a disadvantage of being dependent upon a high vacuum of $10^{-1}$ Pa or less in the deposition chamber.

It is known (e.g., see Adams, U.S. Pat. Pub. No. 2010/0193480) to use a TIG-welding torch to build objects by SFFF, where successive layers of metallic feedstock material with low ductility are applied onto a substrate. A plasma stream is created by energizing a flowing gas using an arc electrode, the arc electrode having a variable magnitude current supplied thereto. The plasma stream is directed to a predetermined targeted region to preheat the predetermined targeted region prior to deposition. The current is adjusted and the feedstock material is introduced into the plasma stream to deposit molten feedstock in the predetermined targeted region. The current is adjusted and the molten feedstock is slowly cooled at an elevated temperature, typically above the brittle-to-ductile transition temperature of the feedstock material, in a cooling phase to minimize the occurrence of material stresses.

Withers et al. (U.S. Pat. Pub. No. 2006/185473) also describes using a TIG torch in place of the expensive laser traditionally used in a solid freeform fabrication (SFFF) process with relatively low cost titanium feed material by combining the titanium feed and alloying components in a way that considerably reduces the cost of the raw materials. Withers et al. also describes using titanium sponge material mixed with alloying elements formed into a wire where it can be used in an SFFF process in combination with a plasma welding torch or other high power energy beams to produce near net shaped titanium components.

Abbott et al. (WO 2006/133034, 2006) describes a direct metal deposition process using a laser/arc hybrid process to manufacture complex three-dimensional shapes comprising the steps of providing a substrate and depositing a first molten metal layer on the substrate from a metal feedstock using laser radiation and an electric arc. The electric arc in gas metal arc welding can be provided by using the metal feedstock as an electrode. Abbott et al. teaches that the use of laser radiation in combination with gas metal arc welding stabilizes the arc and purportedly provides higher deposition rates. Abbott et al. utilizes a consumable electrode guided by and exiting out of a wire guide. The metal of the consumable electrode is melted at the end and the molten metal is deposited by positioning the end over the deposition point. The required heat for melting the consumable electrode is supplied by an electric arc expanding between the tip of the electrode and the workpiece/deposition substrate, and by a laser irradiating the deposition area. Welding by melting a consumable electrode heated by an electric arc is known as gas metal arc welding (GMAW), of which in the case of using non-reactive gases to make the arc is also denoted as metal inert gas welding (MIG-welding).

Titanium metal or titanium alloys heated above 400° C. may be subject to oxidation upon contact with oxygen. It is thus necessary to protect the weld and heated object which is being formed by layered manufacture against oxygen in the ambient atmosphere. WO 2009/068843 discloses an inert gas shield for welding which produces an even outflow of protecting inert gas. By placing the shield above the object which needs to be protected, the even flow of inert gas will displace ambient atmosphere without creating vortexes which may entrain ambient oxygen containing gas. The shield can be formed as a hollow box of which the inert gas enters the interior and is allowed to escape the interior of the box through a set of narrow openings made in one wall of the box. Another solution to preventing oxidation of the titanium is to conduct the deposition process under vacuum.

For the above processes, the apparatus used often involves a single chamber that is required to be evacuated or in which the atmosphere must be replaced every time it is loaded or unloaded and before the deposition can begin. Similar types of single chamber apparatuses are also used in coating and heating processes. Some examples include those disclosed in U.S. Pat. No. 4,328,257 disclosing a single chamber apparatus used for plasma coating. U.S. Patent Application Publication No. 2005/0173380 discloses a single vacuum chamber equipped with an electron beam gun used to accomplish the deposition. U.S. Patent Application Publication No. 2002/0139780 discloses a single chamber apparatus used for welding deposition.

A problem to be addressed is the speed of the deposition process and the expenses resulting from the evacuation the chamber every time a new substrate is loaded or unloaded. Also, during plasma arc deposition, it is important to be able to control the temperature of chamber and of the equipment to prevent overheating. The temperature control must be achieved while still preventing the titanium metal or titanium alloys being heated above 400° C. from being subject to oxidation by preventing contact with oxygen.

There exists a need, therefore, for a chamber deposition system that provides a more efficient and cost effective process that addresses one or more of the above problems. This can further lead to increased throughput and yield of direct metal deposition formed products without the risk of oxidation.

SUMMARY OF THE INVENTION

An objective of the present invention is to provide an apparatus that allows increased throughput and yield of products formed using direct metal deposition or SFFF without having to spend the time and expense to replace the atmosphere in the deposition chamber every time service to the deposition apparatus is necessary or every time a holding substrate is loaded or a workpiece unloaded from the deposition chamber.

Another objective of the invention is to provide an apparatus for rapid layered manufacturing of objects in titanium or titanium alloys.

This invention addresses the needs for an improved, economical method of performing direct metal deposition. This invention further addresses the need for a method of increasing throughput and yield of direct metal deposition formed parts.

Provided herein is a chamber system for solid free form fabrication having one or more independently controlled loading/unloading chambers. The chamber system may include at least one independently controlled deposition chamber, the deposition chamber including a deposition apparatus and an actuator that controls the position and movement of the base material. One or more doors connect the deposition chamber with each of one or more loading/unloading chambers. Optionally an independently controlled service chamber can be connected to the deposition chamber, the service chamber sized to house the deposition apparatus.

Each of the one or more loading/unloading chambers can include one or more doors providing access to the loading/unloading chamber. A conveyor or like system can be located inside each loading/unloading chamber. Also, each loading/unloading chamber may be equipped with one or more vents. One or more vents can be located at an upper portion of the loading/unloading chamber and one or more vents can be located at a bottom portion of the loading/unloading chamber. The one or more vents located at the upper portion can be operatively connected to a vacuum pump and to an air supply. The one or more vents located at the bottom portion can be operatively connected to a vacuum pump and to a source of inert gas or inert gas mixture. Two loading/unloading chambers can have a wall shared between them. Also, each of the two loading/unloading chambers can include a common wall with the deposition chamber.

The deposition chamber can also include one or more vents located at an upper portion of the deposition chamber and one or more vents located at a bottom portion of the deposition chamber. Like the loading/unloading chambers, one or more vents located at the upper portion can be operatively connected to a vacuum pump and to an air supply and one or more vents located at the bottom portion can be operatively connected to a vacuum pump and to a source of inert gas or inert gas mixture. The deposition chamber can also include one or more viewing portals. The deposition chamber can include a recirculation system having a fan and a heat exchanger.

The service chamber can be aligned with the deposition chamber and the deposition apparatus such that the deposition apparatus can move in and out of the service chamber without removing or bending the wire from the wire feeding system. The service chamber can also include one or more vents at an upper portion of the service chamber and one or more vents at a bottom portion of the service chamber. The one or more vents located at the upper portion can be operatively connected to a vacuum pump and to an air supply, and the one or more vents located at the bottom portion can be operatively connected to a vacuum pump and to a source of inert gas or inert gas mixture. The service chamber can include an access portal. The service chamber also can include a set of gloves.

Also provided herein are methods of operating a chamber system for SFFF. Methods of operating a chamber system for solid free form fabrication can include independently replacing the atmosphere in the deposition chamber of a chamber system with an inert atmosphere; transferring a first holding substrate on an actuator located inside the deposition chamber while maintaining the inert atmosphere in the deposition chamber; performing solid free form fabrication to form a first workpiece; and transferring the first workpiece out of the deposition chamber while maintaining the inert atmosphere in the deposition chamber. The chamber system can include at least two loading/unloading chambers and a service chamber, each of the two loading/unloading chambers and service chamber being in communication with the deposition chamber through one or more independent openings. One or more of the deposition chamber, the at least two loading/unloading chambers and service chamber have one or more doors to seal the one or more openings. Each of the deposition chamber, first and second loading/unloading chambers and the service chamber can be controlled independently. The one or more doors at each of the deposition chamber, first and second loading/unloading chambers and the service chamber can be controlled using one or more sensors. The solid free form fabrication can be stopped if one or more sensors detects that at least one door is not properly sealed closed.

The methods can also include loading a first holding substrate on a conveyor located inside a first loading/unloading chambers; replacing the atmosphere in the first loading/unloading chamber with the same inert atmosphere as in the deposition chamber; and maintaining the atmosphere inside the first loading/unloading chamber during transfer of the holding substrate onto the actuator and during solid free form fabrication. The methods can also include loading a second holding substrate onto a conveyor of a second loading/unloading chamber while maintaining the inert atmosphere in the first loading/unloading chamber; replacing the atmosphere of the second loading/unloading chamber with the same inert atmosphere as in the deposition chamber. The first workpiece can be unloading by transferring it out of the deposition chamber and into the first loading/unloading chamber while maintaining the inert atmosphere in the first loading/unloading chamber; sealing the first loading/unloading chamber from the deposition chamber; replacing the inert atmosphere in the first loading/unloading chamber with ambient air; and unloading the workpiece from the loading/unloading chamber. After sealing the first loading/unloading chamber from the deposition chamber, a second holding substrate can be transferred from a second loading/unloading chamber on the actuator while maintaining the inert atmosphere in the deposition chamber.

Additional features and advantages of the invention will be set forth in the description which follows, and in part will be apparent from the description, or can be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

A. DEFINITIONS

Figure 1:
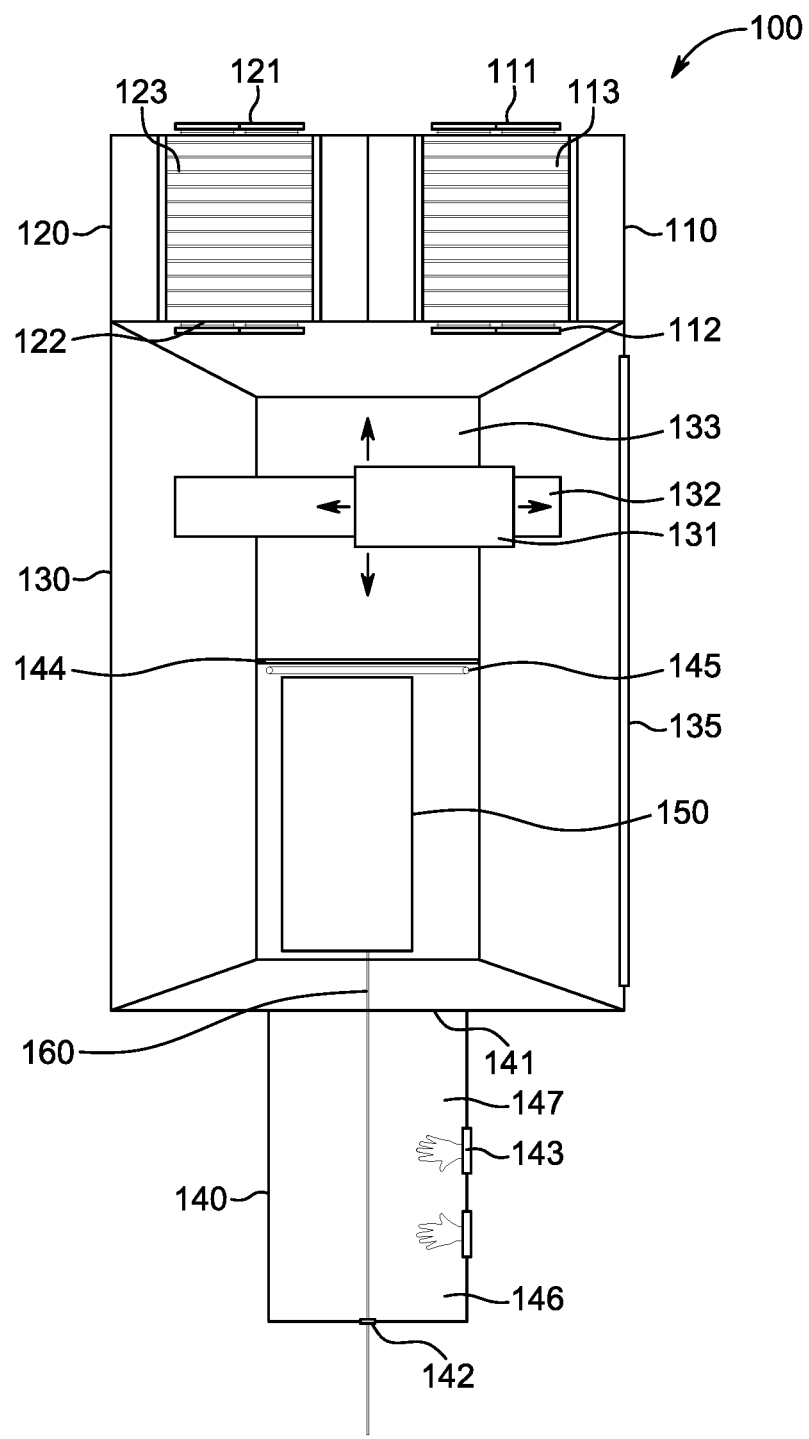
FIG. 1 is an illustrative diagrammatic top view of a chamber system according to an exemplary embodiment in which the deposition apparatus is located inside the deposition chamber.

Unless defined otherwise, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety. In the event that there are a plurality of definitions for terms herein, those in this section prevail. Where reference is made to a URL or other such identifier or address, it is understood that such identifiers can change and particular information on the internet can come and go, but equivalent information can be found by searching the internet. Reference thereto evidences the availability and public dissemination of such information.

As used herein, the singular forms "a," "an" and "the" include plural referents unless the context clearly dictates otherwise.

As used herein, the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

As used herein, ranges and quantities can be expressed as "about" a particular value or range. "About" also includes the exact amount. Hence "about 5 percent" means "about 5 percent" and also "5 percent." "About" means within typical experimental error for the application or purpose intended.

As used herein, "optional" or "optionally" means that the subsequently described event or circumstance does or does not occur, and that the description includes instances where the event or circumstance occurs and instances where it does not. For example, an optional component in a system means that the component may be present or may not be present in the system.

As used herein, a "combination" refers to any association between two items or among more than two items. The association can be spatial or refer to the use of the two or more items for a common purpose.

As used herein, "solid free form fabrication" refers to an additive prototyping and manufacturing process in which a three-dimensional object is formed by successively adding layers of material to form the final object.

As used herein, the term "workpiece" refers to a metal body produced using solid free form fabrication.

As used herein, "SFFF" refers to solid free form fabrication.

As used herein, a "Plasma Arc Welding torch" or "PAW torch" refers to a welding torch that can be used in plasma arc welding. The torch is designed so that a gas can be heated to a high temperature to form plasma and becomes electrically conductive, the plasma then transfers an electric arc to a base material, and the intense heat of the arc can melt metal and/or fuse two pieces of metal together. A PAW torch can include a nozzle for constricting the arc thereby increasing the power density of the arc. The plasma gas typically is argon. Plasma gas can be fed along an electrode and ionized and accelerated in the vicinity of a cathode. The arc can be directed towards the base material and is more stable than a free burning arc (such as in a TIG torch). The PAW torch also typically has an outer nozzle for providing a shielding gas. The shielding gas can be argon, helium or combinations thereof, and the shielding gas assists minimizing oxidation of the molten metal. Current typically is up to 400 A, and voltage typically is in the range of about 25-35 V (but can be up to about 14 kW). PAW torches include plasma transferred arc torches.

The term "plasma transferred arc torch" or "PTA torch" as used interchangeably herein refers to any device able to heat and excite a stream of inert gas to plasma by an electric arc discharge and then transfer the flow of plasma gas including the electric arc out through an orifice (such as a nozzle) to form a constricted plume that extends out of the orifice and transfers the intense heat of the arc to a target region. In exemplary embodiments a PTA torch can be operated with effects of 5-6 kW or higher.

The term "wire feed" as used herein refers to the wire being fed to the deposition apparatus that melts the wire feed during solid free form fabrication. The term "wire feed material" as used herein refers to the material that makes up the wire feed and can be any known or conceivable metal or metal alloy which can be formed into a wire and employed in a solid freeform fabrication process to form a three-dimensional object. Examples of suitable materials include, but are not limited to: titanium and titanium alloys such as i.e. Ti-6Al-4V alloys, nickel or nickel alloys.

The term "holding substrate" as used herein refers to the target substrate that is first loaded into the chambers upon which additional material, the same or different from that of the holding substrate, is deposited using the technique of SFFF of solid free form fabrication to form a workpiece. In exemplary embodiments, the holding substrate is a flat sheet. In alternative embodiments, the holding substrate may be a forged part. In alternative embodiments, the holding substrate may be an object upon which additional material is to be deposited. In exemplary embodiments, the holding substrate can become part of the workpiece. The material for the holding substrate can be a metal or a metal alloy. In exemplary embodiments, the holding substrate is made of the same metal as the wire feed material.

The term "base material" as used herein refers to the target material. This will be the holding substrate when depositing the first layer of material. When one or more layers of material have been deposited horizontally onto the holding substrate, the base material will be the upper layer of deposited metallic material that is to have deposited a new layer of metallic material. The base material and the deposited material may be metals or metal alloys. In exemplary embodiments, the base material is the same as the wire feed material.

The term "deposition apparatus" as used herein refers to any system that can be used for solid free form fabrication. Exemplary embodiments of solid free form systems include those using plasma arc (PAW), including plasma transferred arc (PTA), laser sintering, electron beam, or any combination thereof as a heat source for welding. In exemplary embodiments the deposition apparatus includes one or more torches such as PAW torch, laser torch or electron beam gun or torch. In exemplary embodiments the deposition apparatus includes one or more transferred plasma arc torches. A PAW torch can be of any configuration capable of creating an electric arc to heat and melt the consumable electrode, such as a metal wire, such as gas metal arc welding (GMAW) torch or a tungsten inert gas (TIG) torch, particularly using inert or nobel gases to make the arc. The metal wire is used as a consumable electrode and is melted in the plasma produced by the torch using an electric arc, and the melting consumable electrode is deposited onto the surface of or into a molten pool on the base material to add to, and to form, the near net shape metal bodies or workpieces. Laser devices can generate a laser beam having sufficient thermal energy to melt the metal wire onto a base material. Examples of suitable laser devices include a neodymium-doped yttrium aluminum garnet (Nd:YAG) laser, a $CO_2$ laser, a CO laser, a ytterbium fiber coupled diode laser, a Nd:glass laser, a neodymium-doped yttrium orthovanadate (Nd:YVO) laser, a Cr:ruby laser, a diode laser, a diode pumped laser, an excimer laser, a gas laser, a semiconductor laser, a solid-state laser, a dye laser, an X-ray laser, a free-electron laser, an ion laser, a gas mixture laser, a chemical laser, and combinations thereof. Preferred are Nd:YAG lasers and $CO_2$ lasers. Electron beam devices can be used for heating and melting a metal wire onto a base material. The electron beam device can be arranged and disposed to direct an electron beam on the tip (distal end) of a metal wire positioned above the base material, so that the thermal energy produced by the electron beam of the electron beam device melts the end of the wire, forming droplets of molten metal wire that drop onto the base material beneath the end of the metal wire. The electron beam device can have a variable power output that can be adjusted to provide a substantially constant power or energy amount to the metal wire in an amount that provides substantially constant melting rate of the metal wire. Electron beam guns are commercially available and described in the art. The electron beam gun can be selected so that it contains electromagnetic coils to modulate the electron beam. The electron beam gun can provide energy in the form of a concentrated stream of electrons accelerated towards the metal wire. The electrons can be accelerated using a high voltage potential (e.g., greater than about 15 kV, such as in the range of from about 15 kV to about 150 kV) alone or in combination with magnetic fields. The electrons may be generated within the electron beam gun using one or more heated filaments. The output power of the electron beam gun typically can be controlled by regulating the flow of electrons to the work piece. For example, a beam power of up to about 30 kW can be used, but generally is within the range of from about 2.5 kW to about 10 kW, or from about 3 kW to about 6 kW. The beam current generally is greater than about 100 milliamps, and can be in the range of from about 100 milliamps to about 600 milliamps. The beam power is variable, and is generated by using an input voltage in the range of from about 100 V to about 500 V. An exemplary input voltage is about 110 V.

The term "computer assisted design model" or "CAD-model" as used interchangeably herein refers to any known or conceivable virtual three-dimensional representation of the object that is to be formed which can be employed in the control system of the arrangement according to the second aspect of the invention: to regulate the position and movement of the holding substrate and to operate the welding torch with integrated wire feeder such that a physical object is built by fusing successive deposits of the metallic material onto the holding substrate in a pattern which results in building a physical object according to the virtual three-dimensional model of the object. This may, for instance, be obtained by forming a virtual vectorized layered model of the three-dimensional model by first dividing the virtual three-dimensional model into a set of virtual parallel layers and then dividing each of the parallel layers into a set of virtual quasi one-dimensional pieces. Then, the physical object can be formed by engaging the control system to deposit and fuse a series of quasi one-dimensional pieces (droplets) of the metallic material feed onto the supporting substrate in a pattern according to the first layer of the virtual vectorized layered model of the object. The metallic material feed also can be deposited as a continuous supply of droplets, which can form a string or stream of metallic material. Then, repeating the sequence for the second layer of the object by depositing and fusing a series of quasi one-dimensional pieces of the weldable material onto the previous deposited layer in a pattern according to the second layer of the virtual vectorized layered model of the object. Repetition continues during the deposition and fusing process layer by layer for each successive layer of the virtual vectorized layered model of the object until the entire object is formed.

However, the invention is not tied to any specific CAD-model and/or computer software for running the control system of the arrangement according to the invention, and nor is the invention tied to any specific type of control system. Any known or conceivable control system (CAD-model, computer-aided manufacture (CAM) system or software, computer software, computer hardware and actuators etc.) able to build metallic three-dimensional objects by solid freeform fabrication may be employed. In exemplary embodiments, the control system can be adjusted to separately operate a first torch to preheat the base material and a second torch to melt the feed wire of metallic material into the molten pool. The first torch can provide sufficient energy to preheat the base material so that it is receptive to molten drops of melted metal wire, i.e. melted metallic material, at the position at which the melted metallic material is to be deposited. Preheating the base material can ensure adequate melt-in to the base material by the metallic material provided by the metal droplet of the melted metal wire. The first torch promotes fusion between the base material and the melted metallic material by deepening the melt-in in the base material. In some embodiments, the preheating does not melt the base material. In alternative embodiments, at least a portion of the base material is melted by the first to make the base material more receptive. In some embodiments, sufficient heat is applied by the first torch to form a molten pool in the base material at the position at which the metallic material is to be deposited.

B. MULTI-CHAMBER ASSEMBLY

Exemplary embodiments are described below in conjunction with the accompanying figures. The following description is only illustrative and should not be viewed as limiting.

FIG. 1 shows a diagram of an exemplary chamber system 100 having four chambers 110, 120, 130, and 140. The four chambers can be connected to each other. For purposes of this descriptions chambers 110 and 120 will be referred to as the loading/unloading chambers, chamber 130 will be referred to as the deposition chamber and chamber 140 will be referred to as the service chamber.

As their respective names implies, loading/unloading chambers 110 and 120 can be used to load holding substrates to be used to form the objects by solid free form fabrication and to unload formed workpieces. Likewise, deposition chamber 130 is a chamber in which the solid free form fabrication process occurs. In exemplary embodiments the solid free form fabrication is performed using plasma transferred arc torches. In an exemplary embodiment the deposition apparatus is a wire fed deposition apparatus that employs two plasma transferred arc torches, one to form a molten pool in a base material into which melted metal from the wire feed drops, and the second torch to melt the wire feed metal. In exemplary embodiments the wire feed material and the base material are the same. In exemplary embodiments the wire feed material and base material are the metals or metal alloys. In exemplary embodiments they are the same metal or metal alloy. Exemplary metals or metal alloys for the wire feed material and base material are titanium, titanium alloys, nickel, or nickel alloys. Other metals or metal alloys can also be used. Service chamber 140 can be a chamber dedicated to maintenance work on the deposition apparatus.

Although the illustrative embodiments will be described as having four chambers, it should be understood that loading/unloading chambers 110 and 120 could be replaced by a single loading/unloading chamber. Alternatively, more than two loading/unloading chambers could be employed and similarly connected to the deposition chamber. Moreover, it should also be understood that an embodiment of the invention may exclude service chamber 140.

Each chamber of chamber system 100 can be sealed off and independently controlled. Each chamber can be sealed off from other chambers connected thereto. Each chamber can also be sealed off from the outside atmosphere. Each chamber can be separated from other chambers or from the outside atmosphere by using one or more swinging or sliding sealing doors. In exemplary embodiments, a door may be made of the same material as the chamber. In alternative embodiments each door may be made of a sealing material. In exemplary embodiments, independent of the material the door is made of, each door may be equipped with a sealing member. The sealing member can be a ring, membrane or gasket. The sealing material used for the sealing member or chamber door should be able to provide a gas impermeable seal. In exemplary embodiments the sealing material is any high vacuum sealing material. In exemplary embodiments, the sealing material can be polyurethane. In alternative embodiments the sealing material can be any one of nitrile rubber, fluorocarbon, silicone, fluorosilicone, or a perfluorinated elastomer. In exemplary embodiments, more than one sealing material can be used for each sealing member or chamber door. In yet alternative embodiments, each door can be equipped with more than one sealing member. For example two or three sealing members can be placed on the door to improve gas impermeability.

The atmosphere in each chamber can be independently evacuated. In some embodiments each chamber independently can be evacuated and replaced with an atmosphere free of oxygen. In some embodiments each chamber independently can be evacuated and then filled with an inert gas or gas mixture. Each chamber can be equipped with an individual flow controller that can measure and control the flow of gas into the chamber, such as a mass flow controller or volumetric flow controller. Also, the temperature in each chamber can be independently monitored, controlled and maintained. The pressure in each chamber may also be independently monitored, controlled and maintained. In embodiments in which a chamber is filled with an inert gas, such as argon, the pressure of that chamber is preferably maintained above atmospheric pressure. In exemplary embodiments, the pressure of a chamber filled with an inert gas is kept at about 1 to 6 millibars above atmospheric pressure. Maintaining the pressure of a chamber above atmospheric pressure will assist in preventing oxygen or other gases from outside the chamber from leaking into the chamber. Any inert gas may be used to form an inert atmosphere. In exemplary embodiments the inert gas used is heavier than air. An exemplary inert gas is argon. Other inert gases may also be used, alone or in combination. In some embodiments, a gas mixture can be used instead of a single gas. For example, a mixture of argon with any of helium, neon, xenon or krypton can be used. Other possible gases that can be used alone or in a mixture include xenon and krypton.

For purposes of this specification the terms "heavy" or "heavier" referring to a gas, gas mixture or atmosphere and the terms "light" or "lighter" also referring to a gas, gas mixture or atmosphere are used to distinguish between any two types of atmospheres that can be used in the chambers described herein. As exemplified above, a heavy or heavier gas is argon or argon-helium mixture when compared to a lighter atmosphere such as air. However, this pairing is only exemplary and should not be viewed as limiting. Also, while herein the vents are described in terms of heavy gas vents and light gas vents, it should be understood that two atmospheres that are equal or very close in weight could also be used in which case any vent can be used for injecting or evacuating either atmosphere.

In exemplary embodiments, when not filled with an inert gas or during the process of filling a chamber with an inert gas, or during the process of evacuating a chamber of an inert gas, the chamber can be maintained at atmospheric pressure. In alternative embodiments, when not filled with an inert gas, a chamber may be maintained at vacuum conditions. Also, when filling a chamber with an inert gas or when evacuating a chamber of an inert gas, the pressure in that chamber can be either above or below atmospheric pressure.

Each chamber in chamber system 100 can be made of any suitable material that can withstand the pressure and temperature conditions of the chamber. For example, the material used to form the deposition chamber 130 should withstand the pressure and temperature conditions of the solid free form fabrication process carried out in that chamber. In exemplary embodiments, the chambers are made of a metal. For example, the chambers can be made of aluminum metal or an aluminum alloy. In an alternative embodiment the chambers can be made of steel. Any steel can be used. Exemplary steels include low carbon steel, low alloy steel, high carbon steel, stainless steel, 300 series stainless steel, 400 series stainless steel, austenitic stainless steels, high Cr ferritic steels and Cr—Mo steels. In yet alternative embodiments, the chambers can be made of a combination of metals. The metal walls can be properly grounded to reduce the risk of generation of static discharges, or to minimize the risk of shock in case of any equipment malfunction.

In preferred embodiments, the chambers are maintained at or just above atmospheric pressure, thus a suitable material can include a material that is able to at least maintain physical integrity at least at atmospheric pressure or at a pressure that is from about 1-20 millibars above atmospheric pressure, or from about 1-10 millibars above atmospheric pressure, or about 2-8 millibars above atmospheric pressure. Preferably the material used for the chambers will also be able to maintain physical integrity below atmospheric pressure, such as under a vacuum. In such embodiments the material used should be able to maintain physical integrity at a pressure that is below atmospheric pressure, particularly under the vacuum conditions used.

Any chamber of chamber system 100 can also be equipped with one or more viewing portals so as to allow an operator to view the inside operation. In exemplary embodiments the viewing portals can be windows. The description herein will refer to the viewing portals as windows, however, this should not be viewed as limiting as any type of viewing portal can be implemented herein. In exemplary embodiments, deposition chamber 130 may have a large window on at least one side so as to allow an operator to view the on-going fabrication process. Also, in a preferred embodiment service chamber 140 can also be equipped with at least one large window to allow an operator to view the deposition apparatus 150 when inside service chamber 140. The one or more windows can be made of any suitable transparent material that can also withstand the pressure and temperature conditions of the chamber. For example, the material used to form the window in deposition chamber 130 should withstand the pressure and temperature conditions of the solid free form fabrication process carried out in that chamber. In exemplary embodiments, the material used for the windows in any one or more chambers is an acrylic material. In exemplary embodiments, the windows are made of poly(methyl methacrylate). Alternatively, the window material can be a glass. In exemplary embodiments, the windows are made of soda-lime-silicate glass. The glass can be coated with one or more transparent metal oxide layers that can reflect selected wavelengths of electromagnetic radiation. In some embodiments, the glass can reflect infrared electromagnetic radiation. In some embodiments, the glass can reflect ultraviolet electromagnetic radiation. The glass can be present in a single layer, or a plurality of layers of glass can be used. In some embodiments, at least two glass layers are present, separated by a space. The space between the two layers of glass can be filled with an inert gas. In some embodiments, the space between the two layers of glass is filled with argon. This configuration can block up to about 85% ultraviolet radiation from being transmitted through the window. In some embodiments, at least two glass layers are present, and an interlayer of polymer film present between the two glass layers, forming a laminated glass. The polymer film can be of any polymeric material, such as polyvinylbutyral (PVB), ethylene vinyl acetate (EVA). The laminated glass can block nearly 100% ultraviolet radiation from being transmitted through the window.

Alternatively, the window material can be a thermoplastic polymer. For example, the material may be a polycarbonate, acrylic or polyethylene terephthalate. The thermoplastic can be present as a single layer, or two or more sheets can be fabricated to include a space between the sheets, which optionally can be filled with argon, or a laminated plastic window can be prepared by including an interlayer of polymer film between two sheets of thermoplastic polymer. The material used for the one or more windows of one chamber can be the same or different from the material used for the one or more windows of any other chamber. Also, different windows of one chamber can be made of the same or different materials.

In exemplary embodiments one or more chambers can be equipped with one or more viewing devices. Exemplary viewing devices can be video cameras. The video captured by the one or more cameras can be recorded. The video can also be streamed live. Video screens playing the video, live or recorded mode, can be provided on the outside of the respective chamber from which the video was captured. The video can be viewed on a monitor proximate to the chamber from which the video was captured. The video can be viewed on a monitor located at a remote location from the chamber in which the video was captured. Any combination of viewing videos arrangements described above can also be used.

Each chamber can also be equipped with one or more light emitting elements as sources of visible light to illuminate the chamber. These can provide lighting inside the one or more chambers so as to provide for better visibility. A uniform brightness level in the chamber can be obtained by positioning light emitting elements symmetrically around the chamber. The one or more light emitting elements can be any suitable light emitting device. For example, the light emitting element can include light fixtures. Additional examples can include light emitting diode devices, neon lights, incandescent or fluorescent light bulbs, or any combination thereof. The brightness of the light emitting elements can be adjustable. Appropriate protective covers of suitable materials transparent to light can be provided to protect the light emitting element from the conditions of the chamber in which the light emitting element is located. In exemplary embodiments each chamber of chamber system 100 includes at least a light emitting element. In exemplary embodiments deposition chamber 130 includes one or more light emitting elements. In an exemplary embodiments service chamber 140 includes one or more light emitting elements. In exemplary embodiments one or more of loading/unloading chambers 110 and 120 each include one or more light emitting elements. Any combination of these lighting arrangements can also be implemented for chamber system 100. The light emitting elements of each chamber can be independently controlled. Alternatively, all light emitting elements can be connectedly controlled so that they can be turned on and off at the same time. Alternatively, the light emitting elements of two or more chambers of chamber system 100 can be controlled simultaneously. The lighting controls can be one or more manual or computerized control systems or a combination of both.

Each chamber can also be equipped with an oxygen detector or oxygen monitoring device. In exemplary embodiments, the oxygen detector or monitoring device can be used to check the amount of oxygen in the chamber when operated under inert atmosphere. As discussed earlier, during deposition, the metals can be heated to high temperatures rendering them prone to oxidation. For example, titanium at a temperature of 400° C. or higher will typically oxidize in the presence of oxygen. To prevent oxidation it is advantageous to maintain an atmosphere that is free of oxygen or alternatively an atmosphere that has a very low oxygen content. In exemplary embodiments, when operated in an inert atmosphere, the deposition chamber is maintained at a pressure of about $10^5$ Pa with an oxygen content of less than 100 ppm, generally in a range of from about 0 to about 100 ppm, or in a range of about 0 to about 50 ppm. In alternative embodiments, the oxygen content of the deposition chamber under similar conditions may be maintained from about 0 to about 25 ppm or from about 0 to about 20 ppm.

In exemplary embodiments, the oxygen content and other atmospheric conditions including pressure of any other chamber within chamber system 100 is similar to or lower than the oxygen content of the deposition chamber at least when such chambers are placed in atmospheric communication with deposition chamber if it is desired to maintain the deposition chamber in an inert atmosphere. Likewise, in exemplary embodiments in which the deposition chamber is maintained under vacuum, the other chambers of chamber system 100 are also under similar vacuum conditions at least when in atmospheric communication with the deposition chamber. In exemplary embodiments where the deposition chamber contains air, the other chambers may also contain air at least when in atmospheric communication with the deposition chamber. By maintaining the same or similar type of atmospheric conditions between chambers when in atmospheric communication with each other, it is possible to better maintain and control the desired conditions within them. This can be especially important for the deposition chamber because it can help avoid unwanted introduction of impurities or oxidation during the manufacturing process that occurs in the deposition chamber.

In exemplary embodiments, the humidity level within the chamber is controlled. The humidity level is maintained at reduced levels to reduce hydrogen content in the chamber. For example, when the metal wire is or contains titanium, too high a hydrogen content within the chamber can make the deposited titanium brittle. In exemplary embodiments, the humidity level within any of the chambers within chamber system 100 can be reduced to a level less than 250 ppm or less than 200 ppm. In exemplary embodiments, the humidity level of the chambers connected to the deposition chamber is similar to or lower than the humidity level of the deposition chamber, at least when such chambers are placed in atmospheric communication with the deposition chamber if it is desired to maintain the reduced humidity level within the deposition chamber.

Although each chamber can be operated independently, it should be understood that in exemplary embodiments the same equipment can be used to affect more than one chamber. For example, in an exemplary embodiment a single vacuum pump may be employed to create a vacuum in two or more chambers. In an exemplary embodiment a single vacuum pump is connected to all four chambers by a common ventilation system. In such embodiments, the vacuum can be used to evacuate the atmosphere in each chamber independently by using a system of valves that separately connects the ventilation system to each chamber. Thus, by independently opening and closing each valve, the vacuum can be applied to any one or more chambers either simultaneously or at different times. Also, different vents of a chamber can be connected to a vacuum either simultaneously or at different times by controlling a set of valves. Likewise, in exemplary embodiments, a single supply system of inert gas can be connected to two or more chambers by way of independently controlled valves. Thus, by operating each valve independently, inert gas can be provided to each chamber either simultaneously as the other one or more other chambers or at different times.

The system can be configured so that the valves can permit or prevent atmospheric communication between chambers. For example, a first chamber can be isolated from a second chamber so that the first chamber can continue to contain an inert or nobel gas, such as argon, while the second chamber is evacuated. A similar system can be used to supply air or a gas mixture. Supply of inert gas or a gas mixture, air or other atmosphere can be performed by any one or more vents in each chamber through the control of valves. Alternatively, each chamber can be equipped with its own independent vacuum pump. Also, each chamber can be equipped with its own independent source of air, inert gas or gas mixture, or other gas as desired.

Controls for the chamber system 100 and the operation of each chamber can be housed in a control system. A control system can be manually operated. For example, a manually operated control system may include manually operated valves, gears, switches or similar devices. In the alternative, a control system can be automated. For example, the control system can consist of a computerized control system. In yet alternative embodiments, a control system can be a combination of manual and computer controls. Each chamber can be equipped with its own individual control system. In an exemplary embodiment, a single control system can independently control each chamber. An exemplary control system can include an industrial computer, which can be configured to contain a central processing unit for executing a user program, one or more power supplies, and signal modules as inputs and/or outputs. The control system can include a CPU display and integrated shielding of analog signals. Such control systems can be designed by the skilled artisan. An exemplary commercially available system is the SIMATIC-S7-1500 from Siemens AG (Munich, Germany). A separate control system can be used to regulate the equipment located inside the chambers. For example, a separate control system can be used to regulate the actuator 131. An exemplary commercially available system is the IndraMotion MTX system available from Bosch Rexroth AG (Lohr am Main, Germany). A separate control system can be used to control the welding equipment. An exemplary commercially available system is the SIGMATEK C-IPC compact industrial computer system available from SIGMATEK GmbH & Co. KG (Lamprechtshausen, Austria). Each chamber can have its own separate control system for the equipment used therein. Alternatively, each equipment may have an associated separate control system. A central control system can also be used to control the equipment located inside the chambers. Alternatively, central control system can be in communication with each separate control system.

LOADING/UNLOADING CHAMBERS

In an exemplary and illustrative embodiment, chamber system 100 can include two loading/unloading chambers 110 and 120. In alternative embodiments, chamber system 100 can include only one loading/unloading chamber. In yet alternative embodiments, chamber system 100 can include more than two loading/unloading chambers. The operation of a loading/unloading chamber does not change and is independent of how many of these chambers are included in chamber system 100. In the illustrative example shown in FIG. 1, loading/unloading chambers 110 and 120 can be arranged such that they have a wall in common.

An advantage of having at least two loading/unloading chambers is the decrease in production cycle-time that is a result of the ability to more quickly load and unload holding substrates and workpieces. For example, in embodiments in which an inert atmosphere is maintained in the deposition chamber 130, the loading/unloading chamber must also have an inert atmosphere when in atmospheric communication with deposition chamber 130. However, loading a holding substrate into the loading/unloading chamber exposes the loading/unloading chamber to the outside atmosphere. Thus, in order to have a loading/unloading chamber at inert gas atmosphere, the air in the loading/unloading chamber must be flushed out and replaced with inert gas before the door connecting the loading/unloading chamber to the deposition chamber can be opened so that no air is introduced in the inert atmosphere of the deposition chamber. This is likewise the case if the deposition chamber were operated under vacuum conditions or in any atmosphere other than air. By having at least two loading/unloading chambers, it is possible to have one loading/unloading chamber ready to receive a workpiece from the deposition chamber, while the other loading/unloading chamber is ready to load the next holding substrate.

Each loading/unloading chamber can be equipped with at least two doors. In exemplary embodiments, loading/unloading chamber 110 includes a door 111 that provides access to chamber 110 from outside the chamber. Chamber 110 can also be equipped with a second door 112 that connects chamber 110 to deposition chamber 130. Likewise, loading/unloading chamber 120 can be equipped with similar doors 121 and 122. As discussed earlier, each door 111, 112, 121 and 122 can either be made of sealing material or include one or more sealing members such that each door is gas impermeable. Doors 111, 112, 121 and 122 can be sliding doors or swing doors. In exemplary embodiments doors 111, 112, 121 and 122 are sliding doors that slide side to side or top to bottom to open and close. Doors 111, 112, 121 and 122 may also be equipped with hinges that provide pressure on the doors when closed to improve their seal and to release the pressure when the doors are to be opened. In exemplary embodiments doors 111, 112, 121 and 122 can be manually operated. Alternatively, doors 111, 112, 121 and 122 can be operated automatically or by the control system. In exemplary embodiments, doors 111, 112, 121 and 122 can be operated both manually and automatically. Also, each door 111, 112, 121, and 122 can be a set of two or more doors that can be operated simultaneously or independently.

The service chamber and each loading/unloading chamber can be equipped with its own independent ventilation system. For example, each of chambers 110, 120 and 140 can be independently vented. Each of chambers 110, 120 and 140 can independently be filled with an inert gas such as argon. Each of chambers 110, 120 and 140 can independently be filled with air. The inlet flow to any of chambers 110, 120 and 140 can be in the range of from about 100 to about 1500 liters/min. The flow into the chambers can be controlled by a mass flow controller. The pressure within a chamber is close-loop controlled by opening and closing an exhaust valve. For example, closing all of the vents connected to a vacuum while opening at least one vent connected to an inert gas supply can increase the pressure within the chamber. The length of time necessary to replace an air atmosphere within a chamber with an inert gas to achieve a certain oxygen level varies according to the dimensions of the chamber as well as the amount of equipment within the chamber, which displaces a certain volume that otherwise would need to be occupied by the gas within the chamber.

Each of chambers 110, 120 and 140 can independently be kept under vacuum conditions. The atmosphere in each of chambers 110, 120 and 140 can independently be evacuated. Vents used to evacuate the atmosphere of chambers 110, 120 and 140 can operate at any suitable flow rate. The flow rate may be defined by the by the capacity of the fan used. For example, evacuation vents can operate at 3000 to 6000 $Sm^3/hr$. In an exemplary embodiment, the capacity of the fan used is 4500 Sm³/hr. Likewise, inlet vents injecting inert, nobel or other gas or air inside chambers 110, 120 and 140 can operate at any suitable flow rate. In some applications, the maximum inlet flow to any one of chambers 110, 120 and 140 is 1500 L/min. A mass flow controller can be used to regulate the inlet flow of inert gas or other gas or air into any one of the chambers. The inlet flow can be in a range of from about 10 to about 1500 L/min, or from about 100 to 1500 L/min. The pressure within the any one of the chambers can be a closed-loop controlled system, in which the pressure can be regulated by opening and closing an exhaust valve. The system can include an idle mode in which the system is maintained at a desired pressure and oxygen level. During the idle mode, a low flow of inert gas or other gas into any one of the chambers can be maintained, such as a flow in the range of about 10 L/min. to about 100 L/min., and can be modified by adjusting the outlet valve to increase or decrease flow through the exhaust valve. Inlet and outlet vents can also have interchangeable operability. Inlet vents can operate as outlet vents and outlet vents can also operate as inlet vents. The vents can includes valves to control the flow rate of gas through the vents, and thereby regulate the resulting pressure within a chamber. The chamber can include pressure monitors, and in response to a reading from a pressure monitor, the valve of a vent connected to an inert gas source can be opened or closed to adjust the pressure within the chamber.

The temperature and pressure of each of chambers 110 and 120 can be independently controlled and maintained. In exemplary embodiments in which an inert gas heavier than air is used as the atmosphere inside the chamber system 100, loading/unloading chambers 110 and 120 can include one or more vents that introduce the inert gas or gas mixture located at a bottom portion of the chambers and one or more vents connected to a vacuum to evacuate air or other light gasses at an upper portion of the chambers. In this manner the heavier inert gas is introduced from the bottom and the lighter atmosphere, for example air, is vented out from the upper portion of the chambers. Each vent can include a connection to a manifold that allows connection of the vent to several different sources with different gases as well as to a vacuum source, the manifold containing vales to regulate which source will be available to the vent at a given moment. This allows a more effective system to fully flush out and replace the atmosphere with an inert gas. Likewise, if the heavier inert gas or gas mixture is to be replaced with a lighter atmosphere such as air, the bottom vents can be used to evacuate the inert gas and the upper vents can be used to introduce the lighter atmosphere. In exemplary embodiments, one or more bottom vents can be located in the floor. In exemplary embodiments, one or more bottom vents can be located at the bottom of the chamber walls just above the floor. In yet alternative embodiments, one or more bottom vents can be located both in the floor and at the bottom portion of the chamber walls. In exemplary embodiments, one or more upper vents are located in the chamber ceiling. In exemplary embodiments, one or more upper vents are located at the upper portion of the chamber walls just below the chamber ceiling. In exemplary embodiments, one or more upper vents are located both in the ceiling and at the upper portion of the chamber walls just below the chamber ceiling. Each bottom and upper vent independently can be equipped with a fan.

When operating one or more vents to evacuate a gas or atmosphere from chambers 110 and 120 each vent can be connected to separate vacuum pumps. Alternatively, each vent can be connected by way of independently controlled valves to a common vacuum pump used for all of chamber system 100. Each vent can be connected with its own independently controlled valve. Alternatively, two or more vents used to evacuate of chamber 110 can be connected to vacuum via a common independently operated valve. Likewise two or more vents used to evacuate chamber 120 can be connected to vacuum via a common independently operated valve. Alternatively, all upper vents of chamber 110 can be connected to vacuum via a first common independently operated valve and all bottom vents of chamber 110 can be connected to vacuum via a second common independently operated valve. Top and bottom vents in chamber 120 can similarly be connected to vacuum as done in chamber 110.

The vents used to introduce an inert gas, gas mixture, air or other atmosphere into chambers 110 and 120 can be similarly arranged as the vents used to evacuate chambers 110 and 120. For instance, each vent can be connected to an independent source. Alternatively, two or more vents can be connected to a common source. In this latter embodiment, each vent can be independently controlled by an independently controlled valve. Alternatively, two or more vents of chamber 110 can be connected to a common, independently controlled valve. Likewise, two or more vents of chamber 120 can be connected to a common, independently controlled valve. Alternatively, all upper vents of chamber 110 can be connected to a common source via a first common independently operated valve and all bottom vents of chamber 110 can be connected to a common source via a second common independently operated valve. Top and bottom vents in chamber 120 can similarly be connected to one or more sources as done in chamber 110.

Each loading/unloading chamber 110 and 120 can be equipped with temperature control device. The temperature control device of each of chambers 110 and 120 can be independently controlled. The temperature control device can include an electric heater, a gas heater, a heat exchanger, an electric cooling system, a refrigeration system, a chiller or a combination thereof. Each chamber 110 and 120 may also be equipped with one or more thermometers, thermocouples or other temperature sensing devices, or a combination thereof to determine the temperature of the chamber. The temperature sensing devices and temperature control device can be connected to the respective control system that controls the chamber they affect.

Each loading/unloading chamber 110 and 120 can also be equipped with one or more pressure gauges, vacuum gauges or combination thereof. The gauges can be connected to the respective control system that controls the chamber they measure.

Each loading/unloading chamber 110 and 120 can each be respectively equipped with a transferring mechanism 113 and 123, each able to receive a holding substrate and transfer the holding substrate into the deposition chamber 130. The transferring mechanism 113 and 123 can also be able to retrieve a workpiece from the deposition chamber 130 and transfer it to another location, for example to the operator space outside the chamber.

Any transferring mechanism that can handle the weight of the holding substrate and workpiece and the atmosphere, temperature and pressure of the chamber can be used for transferring mechanism 113 and 123. In exemplary embodiments, the transferring mechanism can be a conveyor. In exemplary embodiments, the conveyor can comprise a conveyor belt, a chain conveyor, or other mechanical conveyor system. The conveyor can include a set of gears and wheels that are able to support and transfer the holding substrate or workpiece. In exemplary embodiments, the transferring mechanism 113 and 123 can also include a set of mechanical and/or hydraulic arms that can assist in the transferring, lifting or positioning of the holding substrate or workpiece. In exemplary embodiments, the transferring mechanism 113 and 123 can further include a set of wheels that can extend to an actuator 131 inside deposition chamber 130. In exemplary embodiments, a pair of extendable arms with wheels are designed to extend to actuator 131. The wheels in the extendable arms can be designed to be positioned underneath the holding substrate or workpiece and then lift the holding substrate or workpiece and position the same either onto actuator 131 or back onto transferring mechanism 113 or 123.

Figure 5A:
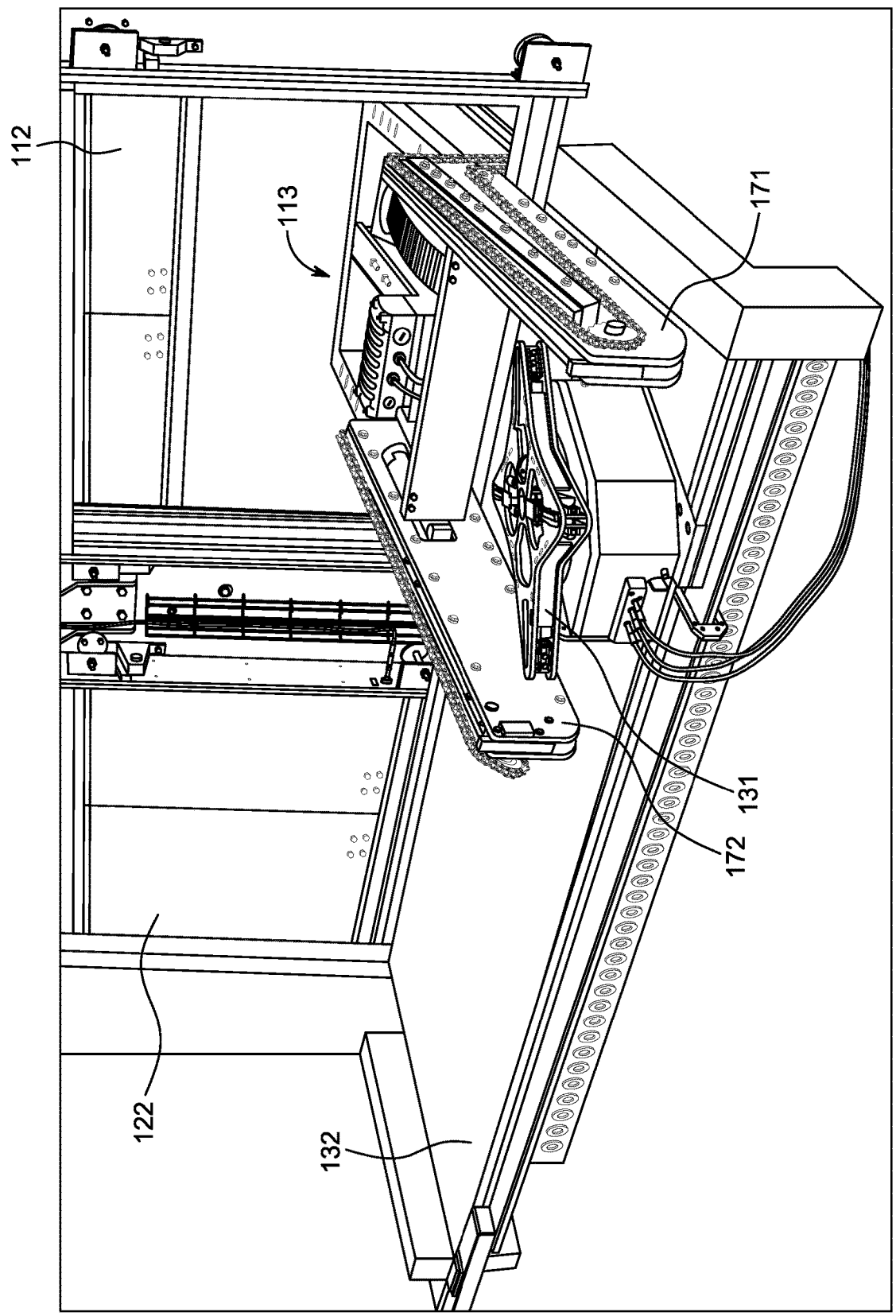
FIGS. 5A and 5B are exemplary embodiments of a transferring mechanism between a loading/unloading chamber and the deposition chamber.
Figure 5B:
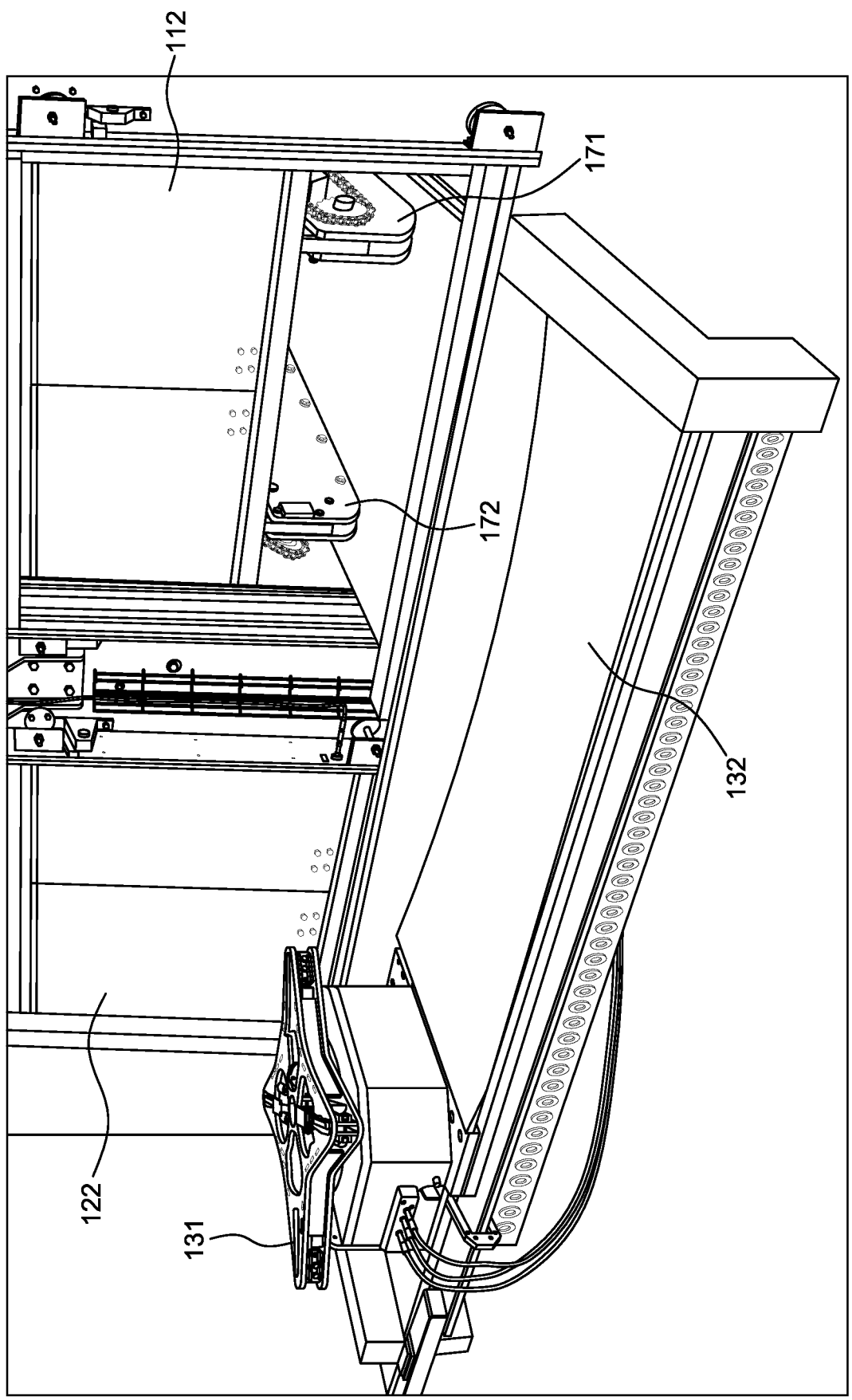

For example, as illustrated in FIGS. 5A and 5B, the transferring mechanism 113 can include a pair of parallel chain conveyors 171 and 172 that can act as arms that can be fully retracted into loading/unloading chamber 110 and extended out of into deposition chamber 130 to reach tracks 132 and 133. Tracks 132 and 133, which can be configured to move orthogonally to each other, can position actuator 131 in front of door 112. When actuator 131 is in position, the a pair of chain conveyors 171 and 172 that make up transferring mechanism 113 are extended out of chamber 110, with one chain conveyor on one side of the actuator 131 and the other chain conveyor on the other side of actuator 131 as for example illustrated in FIG. 5A. Activation of transferring mechanism 113 moves the holding substrate out of chamber 110 and can position the holding substrate above actuator 131. Actuator 131 engages with the holding substrate, such as by elevating the holding substrate relative to the transferring mechanism 113 so that the holding substrate no longer is engaged with transferring mechanism 113. The now disengaged transferring mechanism 113 is retractable into chamber 110 as for example illustrated in FIG. 5B. With the transferring mechanism 113 moved out of the way, tracks 132 and 133 can position the actuator 131 with the attached holding substrate into proper position relative to the deposition apparatus 150 to undergo free form fabrication. The holding substrate, or base material can continued to be moved by actuator 131 during the deposition process. Once the deposition is complete, the workpiece can be transferred back into the loading/unloading chambers in a similar way as it was loading. For example, the actuator 131 carrying the workpiece can position itself in front of the door to the loading/unloading chamber, and the transferring mechanism 113 can again extend arms 171 and 172 from the loading/unloading chamber into the deposition chamber and lift the workpiece off the actuator 131. The transferring mechanism 113 can then carry the workpiece into the loading/unloading chamber by retracting into the loading/unloading chamber while carrying the workpiece. In exemplary embodiments a set of rollers or a similar supporting and transferring structure (not shown) may also be provided outside chambers 110 and 120 in proximity of doors 111 and 121 to aid in the loading and unloading of holding substrates and workpieces.

In exemplary embodiments, loading/unloading chambers 110 and 120 are under the same atmospheric conditions as deposition chamber 130 when in communication with deposition chamber 130. Thus, for example, if deposition chamber 130 is operated under inert gas atmosphere, loading/unloading chambers 110 and 120 are also operated under inert gas atmosphere when in atmospheric communication with deposition chamber 130. In such exemplary embodiments, the inert gas atmosphere may include argon, or an argon-helium mixture.

Any one or more of the doors providing access to loading/unloading chambers 110 and 120 can be equipped with one or more sensors able to detect when the given door is open or closed. The one or more sensors can be connected to the control system controlling deposition apparatus 150. In exemplary embodiments, if the any one of the one or more sensors detects that any one or more of the doors of loading/unloading chambers 110 and 120 is opened when the one or more doors should be closed, or if the one or more doors are not properly sealed shut as they should be, the one or more sensor can communicate it to one or more control systems of chamber system 100. The one or more control systems can send a signal to deposition apparatus 150 to stop the fabrication process if in progress or to prevent it from starting. The one or more sensors can also trigger an audible alarm, such as siren, warning voice and/or beeping noise, visual alarm, such as a flashing light, blinking of light emitting elements inside one or more chambers, screen warnings on the one or more control systems, or combination thereof.

DEPOSITION CHAMBER

In exemplary embodiments, chamber system 100 includes at least one deposition chamber 130. Deposition chamber 130 can be large enough to house all the necessary equipment to produce the workpiece using SFFF. In exemplary embodiments, deposition chamber 130 is the largest of the chambers that make up chamber system 100. Deposition chamber 130 is a chamber in which the solid free form fabrication is conducted. Deposition chamber 130 can be designed to withstand the conditions that are required during solid free form fabrication. In exemplary embodiments, the solid free form fabrication is performed using a plasma transferred arc. Particularly, in exemplary embodiments, the solid free form fabrication can be carried out using two plasma transferred arc torches. In alternative embodiments, the solid free form fabrication can use electron beam deposition. Alternatively, the solid free form fabrication can use selective laser sintering. The deposition chamber can be designed and configured so that any solid free form fabrication method or any combination of multiple layer fabrication methods may be conducted inside deposition chamber 130. For illustrative purposes, deposition chamber 130 is described herein in conjunction with a plasma transferred arc type solid free form fabrication method.

Figure 2:
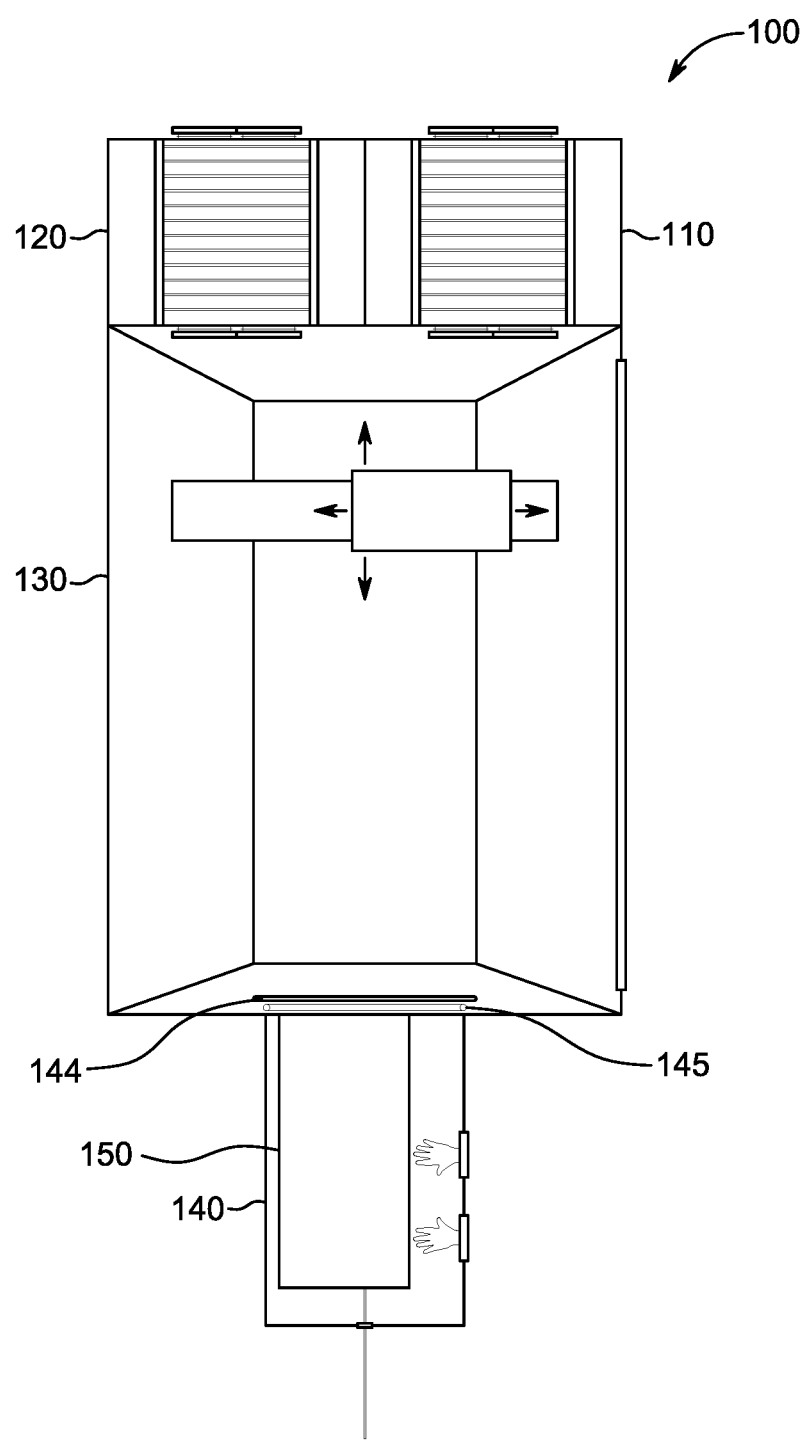
FIG. 2 is an illustrative diagrammatic top view of a chamber system according to an exemplary embodiment in which the deposition apparatus is located inside the service chamber.

In illustrative embodiments, the solid free form fabrication method may involve a movable deposition apparatus 150. The degree of movability of the deposition apparatus 150 can be designed as desired. In exemplary embodiments, the deposition apparatus 150 is provided on a robotic, mechanical, and/or hydraulic arm like device that is able to move the deposition apparatus in any direction during the fabrication process. For example, in a plasma transferred arc fabrication, one or more plasma transferred arc torches may be connected to one or more mechanical arms that can move the plasma transferred arc torches as necessary to form the workpiece. Alternatively, the motion of the deposition apparatus 150 may be limited to only one axis. In other embodiments, the motion of the deposition apparatus 150 may be limited to two axis. For example, as illustrated in FIGS. 1 and 2, the motion of the deposition apparatus 150 may be limited to forward and backward movements along the same line as the wire feed 160. In the illustrated example, the deposition apparatus 150 can be engaged with a track, rail or conveyor system. The track, rail or conveyor system may be located for example on the ceiling of deposition chamber 130. Alternatively the track, rail or conveyor system may be located along a wall of deposition chamber 130. Alternatively, the track, rail or conveyor system may be located on the floor of deposition chamber 130. In exemplary embodiments, deposition apparatus 150 may be connected to more than one track, rail or conveyor system, and the tracks, rails or conveyor systems located on one or more of the ceiling, walls and/or floor of chamber 130. In yet alternative embodiments, deposition apparatus 150 can be fixed and not moveable, but rather it is the workpiece that moves. In yet alternative embodiments, deposition apparatus 150 is movable only in the vertical direction or Z-direction. In yet alternative embodiments the deposition apparatus 150 can move in the vertical direction, i.e. up and down, as well as move from the deposition chamber to the service chamber via one or more tracks, rails and/or conveyor systems as described above.

Any combination of motors, gears, wheels, pulley systems, and conveyors can be used to implement the movement of deposition apparatus 150. Any such motors, gears, wheels, pulley systems and conveyors can be provided on the deposition apparatus 150. Alternatively they can be provided inside or outside deposition chamber 130. In exemplary embodiments, some of the motors, gears, wheels, pulley systems, and conveyors are provided on deposition apparatus 150 and some are provided either inside or outside of deposition chamber 130. The motion of deposition apparatus 150 can be controlled using a control system associated with deposition chamber 130. Alternatively, control of motion of deposition apparatus 150 can be accomplished through an independent control system. The control system for the motion of deposition apparatus 150 can be manual, automated or a combination thereof.

In exemplary embodiments, deposition chamber 130 also includes an actuator 131. Actuator 131 can be used to hold the holding substrate or base material during fabrication of an object. Actuator 131 can also be designed to move the holding substrate, base material, or workpiece in multiple directions. Alternatively, the motion of actuator 131 can be designed to stay in a fixed location. In exemplary embodiments actuator 131 is able to move in multiple directions while deposition apparatus 150 remains in a fixed location during fabrication. Alternatively, deposition apparatus 150 and actuator 131 both move during fabrication. In yet an alternative embodiment, deposition apparatus 150 moves during fabrication while actuator 131 remains in a fixed position. By moving the deposition apparatus 150 and/or the actuator 131 a deposition pattern can be defined to complete the 3-D object or workpiece by depositing successive layers of metallic material obtained from melting the metal wire.

Actuator 131 can be provided on a track system that allows for movement of the actuator in any desired direction. The mechanism used to move the actuator should not be viewed as limiting. In exemplary embodiments illustrated in FIGS. 1 and 2, actuator 131 can be provided on a first track 132 that is able to move actuator 131 along a first axis. Track 132 can itself be provided on a second track 133 that is able to move track 132, and thus actuator 131, along a second axis. In a preferred embodiment the axis of motion of track 132 is perpendicular to the axis of motion of track 133. In the illustrated arrangement, any motion, including a 360° rotation, can be achieved for actuator 131. Actuator 131 can also be equipped with a lifting or lowering arm or piston or a similar device that can move actuator 131 in the vertical direction. Tracks 132 and 133, and actuator 131 can be formed of any material that is suitable for the pressure, temperature, atmosphere, and for holding the holding substrate or workpiece during the solid free form fabrication. In exemplary embodiments, tracks 132 and 133 and actuator 131 are made of the same material. In alternative embodiments actuator 131 is made of a material that is different from that of tracks 132 and 133. Alternatively, each of track 132 and 133, and actuator 131 are made of a different material. Exemplary materials that can be used include metals, such as aluminum, aluminum alloys and steel.

Also, any one or more of actuator 131, and tracks 132 and 133 can be equipped with a heating or cooling system. In exemplary embodiments, one or more of actuator 131, and tracks 132 and 133 is equipped with a heat exchanger. In exemplary embodiments, one or more of actuator 131, and tracks 132 and 133 is equipped with a heater. In exemplary embodiments, one or more of actuator 131, and tracks 132 and 133 is equipped with a heat sink. In exemplary embodiments, one or more of actuator 131, and tracks 132 and 133 is equipped with a chiller or a cooling system involving a cooling fluid. The cooling fluid may be air, an inert gas, or water or other suitable fluids. Examples of cooling fluids that are liquids include water, alkylene glycol (e.g., ethylene or propylene glycol), mineral oil, silicone oil, or combinations thereof. In some applications, the cooling fluid includes water and an alkylene glycol. The cooling fluid on the cold side of the heat exchanger can be selected to be in a temperature range of from about 5° C. to about 25° C.

Tracks 132 and 133 may be operated by any combination of motors, gears, pulley system or like mechanism. The movement of actuator 131 can be controlled by a control system. The control system can be manual or automated. The control system for actuator 131 can be the same system that controls deposition chamber 130. Alternatively actuator 131 can have its own independent control system.

The atmosphere, temperature and pressure of deposition chamber 130 can be monitored, modified and controlled in the same manner as described above for loading/unloading chambers 110 and 120. For example, deposition chamber 130 may be equipped with one or more pressure gauges to monitor the pressure within chamber 130. The pressure gauges can be in communication with a control system that controls chamber 130. Also, deposition chamber 130 can be equipped with temperature control devices. The temperature control devices can include an electric heater, a gas heater, a heat exchanger, chiller, an electric cooling system or a combination thereof. Deposition chamber 130 can be equipped with one or more thermometers, thermocouples or other temperature sensing devices, or a combination thereof to determine the temperature of the chamber. The temperature sensing devices and temperature control devices can be connected to a control system that controls deposition chamber 130.

Figure 4:
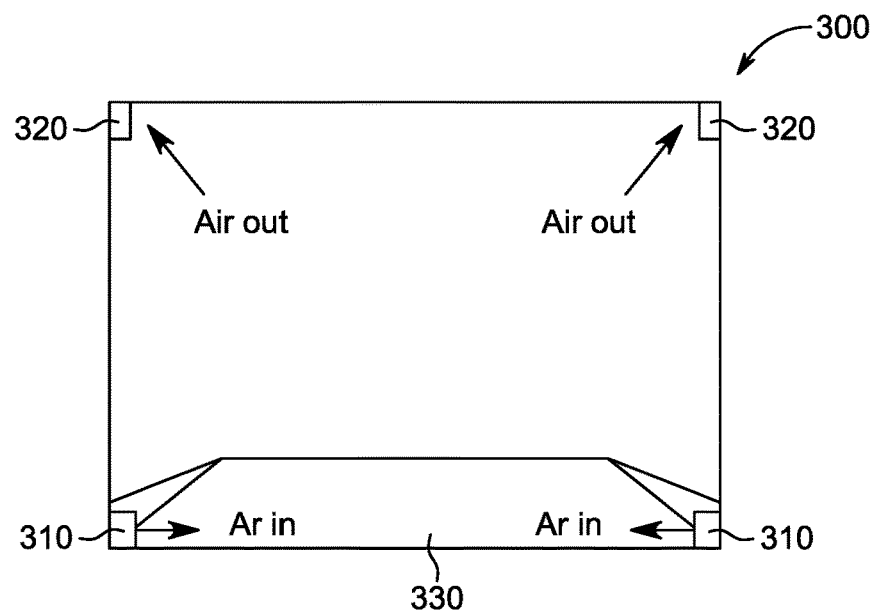
FIG. 4 is a diagrammatic view of the arrangement of vents in an exemplary embodiment, such as in the deposition chamber.

Deposition chamber 130 can be equipped with its own independent ventilation system. Deposition chamber 130 can independently be filled with an inert gas such as argon. Deposition chamber 130 can independently be filled with air. Deposition chamber 130 can independently be kept under vacuum conditions. The atmosphere in deposition chamber 130 can independently be evacuated. The temperature and pressure of deposition chamber 130 can be independently controlled and maintained. As illustrated in FIG. 4, in exemplary embodiments in which an inert gas or gas mixture heavier than air is used as the atmosphere during the solid free form fabrication, deposition chamber 130 can include one or more vacuum or inert gas vents 310 at a bottom portion the chamber and one or more vacuum or air or light gas vents 320 at an upper portion of the chamber. In this manner the heavier inert gas can be inlet or evacuated from the bottom and the lighter atmosphere, for example air, can be inlet or evacuated from the upper portion of the chamber. This allows a more effective system to fully flush out and replace the atmosphere. To further promote avoiding creating any dead pockets of air, the floor 330 of deposition chamber 130 may be curved. As illustrated in FIG. 4, for example, floor 330 can have down sloping sides extending to each chamber wall. Alternatively, floor 330 may have only one or two down sloping sides.

Vents used to evacuate the atmosphere of deposition chamber 130 can operate at any suitable flow rate depending on the capacity of the fan used. For example, evacuation vents can operate at 3000 to 6000 $Sm^3$/hr. In an exemplary embodiment, the capacity of the fan used is 4500 $Sm^3$/hr. Likewise, vents introduce inert or other gas or air inside deposition chamber 130 at any suitable flow rate. In some applications, the maximum inlet flow to the deposition chamber 130 is 1500 L/min. A mass flow controller can be used to regulate the inlet flow of inert gas or other gas or air into the chamber. The inlet flow can be in a range of from about 10 to about 1500 L/min, or from about 100 to 1500 L/min. The pressure within the chamber can be a closed-loop controlled system, in which the pressure can be regulated by opening and closing an exhaust valve. The system can include an idle mode in which the system is maintained at a desired pressure and oxygen level. During the idle mode, a low flow of inert gas or other gas into the chamber can be maintained, such as a flow in the range of about 10 L/min. to about 100 L/min., and can be modified by adjusting the outlet valve to increase or decrease flow through the exhaust valve.

In exemplary embodiments, one or more vents 310 used to introduce or evacuate heavier gas or gas mixture atmosphere can be located in the floor. As shown in FIG. 4, in exemplary embodiments, one or more vents 310 can be located at the bottom of the chamber walls just above the floor. For example, vents 310 could be located at one or more corners of deposition chamber 130, just above where the down sloping side of floor 330 meets the chamber walls. In yet alternative embodiments, one or more vents 310 can be located both in the floor and at the bottom portion of the chamber walls. Vents 310 can be equipped with fans. The vans can be selected (such as to have a desired speed (rpm) and air flow ($m^3$/hr.) and can be positioned so that the operation of the fan minimizes the introduction of any atmospheric turbulence inside the chamber due to the operation of the fans.

In exemplary embodiments, one or more vents 320 used to introduce or evacuate a light gas atmosphere, such as air, are located in the chamber ceiling. In exemplary embodiments, one or more vents 320 are located at the upper portion of the chamber walls just below the chamber ceiling. In exemplary embodiments, one or more vents 320 are located both in the ceiling and at the upper portion of the chamber walls just below the chamber ceiling. Vents 320 can be equipped with a fan.

The vents of deposition chamber 130 can be connected to separate vacuum pumps. Alternatively, the vents of deposition chamber 130 can be connected by way of independently controlled valves to a single vacuum pump used for all of chamber system 100. Each vent can be connected to vacuum with its own independently controlled valve. Alternatively, two or more vents of chamber 130 can be connected to vacuum by way of a common independently operated valve. For example, all upper vents of deposition chamber 130 can be connected to vacuum by way of a first common, independently operated valve, and all bottom vents of deposition chamber 130 can be connected to vacuum by way of a second common, independently operated valve. The pressure within the chamber can be regulated by opening or closing these valves. For example, by closing the vents connects to a vacuum and opening the vents connected to an inert gas, the pressure can be increased. Conversely, by closing the vents connected to an inert gas and opening the vents connected to a vacuum the pressure can be decreased.

The vents of deposition chamber 130 can be similarly arranged with respect to gas sources. For instance, each vent can be connected to an independent gas source. Alternatively, two or more vents can be connected to a common gas source. In this latter embodiment, each vent can be independently controlled by an independently controlled valve. Alternatively, two or more vents of deposition chamber 130 can be connected to a source by way of a common, independently controlled valve. For example, all upper vents can be connected to a first gas source by way of a first common, independently operated valve, and all bottom vents can be connected to a second gas source by way of a second common, independent operated valve. The bottom and upper vents may also all be connected to a common gas source with each group of vents operated by one or more independently controlled valves.

Figure 3:
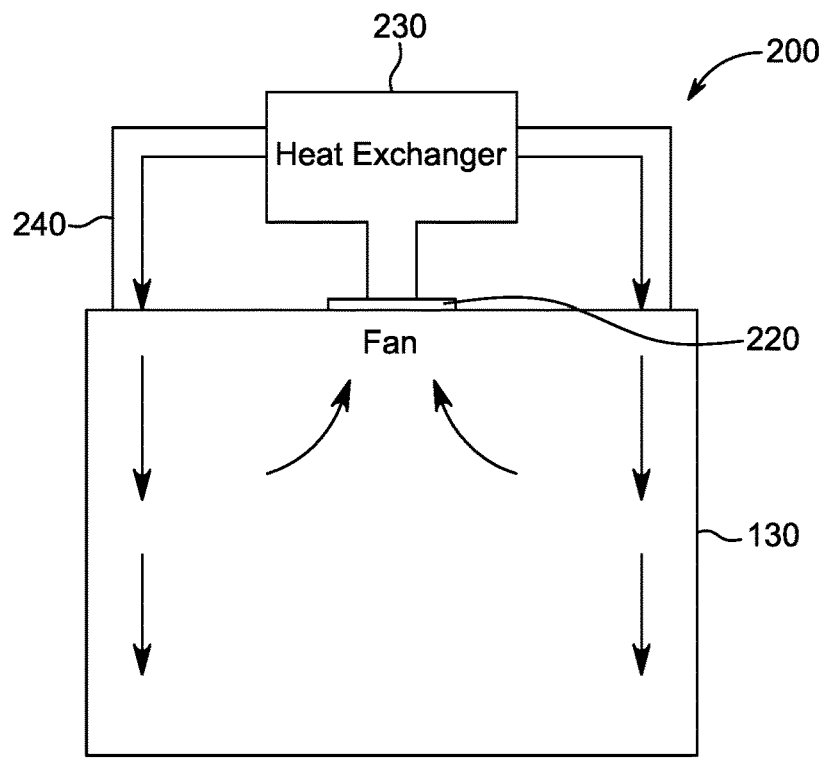
FIG. 3 is a diagrammatic view of a recirculation system that may be used to cool the atmosphere of a chamber, for example the deposition chamber.

As an additional means to control the temperature inside deposition chamber 130, a means for controlling the temperature of the gas inside chamber 130 can be implemented. For example, as illustrated in FIG. 3, deposition chamber 130 may be equipped with a recirculation system 200 that includes a fan 220 and optionally a heat exchanger 230. Fan 220 can be used to intake the gas inside deposition chamber 130 and force it to pass through heat exchanger 230. Heat exchanger 230 can either cool or heat the gas passing through it as desired. In an exemplary embodiment, heat exchanger 230 cools the gas passing through it. After passing through heat exchanger 230, the cooled gas is directed back into deposition chamber 130 by way of pipes and vent system 240. The inlet vents can be located at the ceiling of chamber 130. Alternatively, the vents can be located on the any one or more of chamber walls of chamber 130. Alternatively, the inlet vents can be located at the floor of chamber 130. In exemplary embodiments, the inlet vents can be located in more than one location of the ceiling, chamber walls and floor of deposition chamber 130. The flow rate through recirculation system 200 can be controlled with fan 220. In exemplary embodiments, fan 220 has a capacity ranging from 3000 to 6000 $Sm^3$/hr. In an exemplary embodiment, fan 220 has a capacity of 4500 $Sm^3$/hr. The air flow can be monitored and controlled so as to achieve desired conditions within the chamber. The fans can be selected (such as to have a desired speed (rpm) and air flow ($Sm^3$/hr.) and can be positioned so that the operation of the fan minimizes the introduction of any atmospheric turbulence inside the chamber due to the operation of the fans. In some application, the fans can be turned off during deposition.

The recirculation system 200 can be operated independently of any other ventilation system of chamber 130. Controls for recirculation apparatus 200 can be manual, automated or a combination thereof. In exemplary embodiments, the control system acting on chamber 130 can also control recirculation system 200. Alternatively, recirculation system 200 can have its own independent control system. In exemplary embodiments, recirculation system 200 can be operated during solid free form fabrication to modulate or better control the temperature of deposition chamber 130 during operation. For example, recirculation system 200 can be used to cool the atmosphere inside deposition chamber 130 during plasma transferred arc free form fabrication. Cooling the deposition chamber 130 during fabrication has the benefit of preventing overheating of the deposition chamber 130. It can also prevent overheating of the equipment found in deposition chamber 130. It can further prevent overheating of chamber system 100 overall or at least of adjacent chambers.

As shown in FIG. 1, in exemplary embodiments, deposition chamber 130 is preferably equipped with at least one window 135. More than one window can be formed. The window allows an operator to monitor the solid free form fabrication. The window also allows an operator to monitor the equipment found inside deposition chamber 130. One or more windows 135 can form any portion of the chamber wall where they are provided. For example, a window 135 may occupy the full chamber wall. Alternatively, window 135 may take about three quarter of the chamber wall. Alternatively, window 135 may occupy about half the chamber wall. Alternatively, window 135 may occupy about a quarter of the chamber wall.

As discussed earlier, viewing portals, such as windows, can be made of any suitable transparent material. Examples of transparent materials include glass, acrylic material or thermoplastic polymers. In exemplary embodiments, the viewing portal can be made of an acrylic material, such as poly(methyl methacrylate). Alternatively, the viewing portal can be a glass. In exemplary embodiments, the viewing portal is made of soda-lime-silicate glass. The glass can be coated with one or more transparent metal oxide layers that can reflect selected wavelengths of electromagnetic radiation. In some embodiments, the glass can reflect infrared electromagnetic radiation. In some embodiments, the glass can reflect ultraviolet electromagnetic radiation. The glass can be present in a single layer, or a plurality of layers of glass can be used. In some embodiments, at least two glass layers are present, separated by a space. The space between the two layers of glass can be filled with an inert gas. In some embodiments, the space between the two layers of glass is filled with argon. This configuration can block up to about 85% ultraviolet radiation from being transmitted through the window. In some embodiments, at least two glass layers are present, and an interlayer of polymer film present between the two glass layers, forming a laminated glass. The polymer film can be of any polymeric material, such as polyvinyl-butyral (PVB), ethylene vinyl acetate (EVA). The laminated glass can block nearly 100% ultraviolet radiation from being transmitted through the window.

Alternatively, the viewing portal can be made of a thermoplastic polymer. For example, the viewing portal may be made of a polycarbonate, acrylic or polyethylene terephthalate. The thermoplastic can be present as a single layer, or two or more sheets can be fabricated to include a space between the sheets, which optionally can be filled with argon, or a laminated plastic viewing portal can be prepared by including an interlayer of polymer film between two sheets of thermoplastic polymer. The material used for the one or more viewing portals of one chamber can be the same or different from the material used for the one or more viewing portal of any other chamber. Also, different viewing portals of one chamber can be made of the same or different materials.

Also, a viewing portal of deposition chamber 130 may further be equipped with one or more viewing screens if needed. For example, in embodiments in which plasma transferred arc is used for the solid free form fabrication, it is not possible or it can be difficult to monitor the arc with the naked eye. In fact, attempting to watch the process with the naked eye may result in injury to the eye because of the electromagnetic radiation emitted by the arc. Accordingly, a viewing screen such as a filter lenses with a shade number that provides the appropriate level of protection can be provided at a desired location on the one or more windows 135. In exemplary embodiments the filter lenses with appropriate shade number is provided over the whole window 135. In alternative examples, the filter lenses with appropriate shade number can be provided only at one or more discrete locations on window 135 as desired. Also, different shade numbers can be provided at different locations of window 135 whether a single filter lenses is used over the whole window 135 or if multiple filter lenses are provided at different discrete locations. In exemplary embodiments the shading number can vary between 5 and 15. In exemplary embodiments, the shading number at one or more locations can be 5, 6, 7, 8, 9, 10, 11, 12, 13, 14, or 15.

The filter lenses can be of any appropriate material. Examples of materials include glass, acrylic polymers and thermoplastic polymers. In exemplary embodiments, the filter lenses can be made of an acrylic material, such as poly(methyl methacrylate). Alternatively, filter lenses can be a glass. In exemplary embodiments, the filter lens is made of soda-lime-silicate glass. In alternative embodiments the filter lenses can be made of polycarbonate. The filter lenses can be affixed directly on one or more window 135. Alternatively, filter lenses can be used to form one or more window 135. In alternative embodiments filter lenses may be integrated into one or more window 135. In exemplary embodiments filter lenses can be free standing and positioned in front of window 135. In exemplary embodiments, no filter lenses are provided on one or more window 135.

As discussed earlier, deposition chamber 130, like any of the other chambers, may also be equipped with one or more cameras to monitor the chamber 130. One or more cameras inside deposition chamber 130 may also be used to monitor the fabrication process. The video recorded by the video cameras can be recorded. The video can also be streamed live to a monitor. The monitor can be located outside chamber 130. The monitor can be located proximate to chamber 130. The monitor can be in a location remote to chamber 130. Deposition chamber 130 may also be equipped with one or more illuminating fixtures as described earlier to provide light inside chamber 130.

Deposition chamber 130 may include one or more doors. In exemplary embodiments, deposition chamber 130 may include at least one door to a loading/unloading chamber. In an exemplary embodiment shown in FIG. 1, deposition chamber 130 is connected to two loading/unloading deposition chambers 110 and 120. As shown in FIG. 1 a wall can be shared between deposition chamber 130 and one or more loading/unloading chambers. In the illustrated embodiment, deposition chamber 130 can share the door 112 and 122 with loading/unloading chambers 110 and 120. Doors 112 and 122 have already been described above in conjunction with loading/unloading chambers 110 and 120. In an alternative embodiment, the passage between the deposition chamber and the loading/unloading chambers can be sealed using more than one door. For example two doors may be used facing each other. Whether one door or multiple doors are used, the door can have the same structure and be designed to operate as discussed above already including their materials and optional one or more sealing members. In embodiments in which the loading/unloading chamber and deposition chamber each has its own door, each door can be independently operated. Operation of the door of the loading/unloading chamber can be controlled via the control system of the loading/unloading chamber. Operation of the door of the deposition chamber can be controlled via a control system for the deposition chamber. Alternatively, each door may have its own control system. In yet an alternative embodiment, a control system can be used to operate both doors.

A similar door arrangement as described above between the deposition chamber 130 and one or more loading/unloading chambers can also be provided between deposition chamber 130 and service chamber 140. Alternative embodiments of a sealing door for service chamber 140 will be described below.

Although not illustrated, deposition chamber 130 may also have a door to the outside. The structure and elements of such door would be the same as and designed to operate as the other doors described herein including material and optional use of one or more sealing members.

Any one or more of the doors or opening providing access to deposition chamber 130 can be fitted with one or more sensors able to detect when the given door is open or closed. The one or more sensors can be connected to the control system controlling deposition apparatus 150. In exemplary embodiments, if any one of the one or more sensors detects that any one or more of the doors accessing deposition chamber 130 is opened when it should be closed, or not properly sealed as it should be, they can communicate this by sending a signal to one or more control systems of chamber system 100. If during fabrication, in response to signals received from the one or more sensors the one or more control systems can send a signal to deposition apparatus 150 to stop the fabrication process if in progress or to prevent it from starting. The one or more sensors may also trigger an audible alarm, such as siren, warning voice and/or beeping noise, visual alarm, such as a flashing light, blinking of light emitting elements inside one or more chambers, screen warnings on the one or more control systems, or combination thereof.

SERVICE CHAMBER

Chamber system 100 may optionally include a service chamber 140. Service chamber 140, as its name implies, can be used to service the deposition apparatus 150 without having to access deposition chamber 130 or without exposing chamber 130 to the outside atmosphere. Being able to maintain the desired atmosphere, whether it be vacuum, inert gas, air, or other inside chamber 130 can lead to an economic advantage and less downtime. This is because no energy, materials or time is required to fully replace the atmosphere in deposition chamber 130 every time maintenance service to the deposition apparatus 150 is necessary.

Service chamber 140 can be any desirable size. In exemplary embodiments, service chamber 140 is large enough to at least house deposition apparatus 150. In exemplary embodiments service chamber 140 is at least about 20% larger than the size of deposition apparatus 150. Alternatively, service chamber 140 is at least about 30%, 40%, 50%, 60%, 70%, 80%, 90%, 100%, 125%, 150%, 175%, 200%, 300%, 400%, 500% larger than the size of the deposition apparatus 150. Too large a size of service chamber 140 would require too much energy to evacuate and fill service chamber 140 that would be costly. Service chamber 140 can be used to prevent having to spend the cost and time to evacuate and refill deposition chamber 130, thus the size of service chamber 140 should be much smaller when compared to the size of deposition chamber 130. In exemplary embodiments, the size of chamber 140 is as small as possible that still allows the housing of deposition apparatus 150 and sufficient room to perform at least some maintenance without having to open service chamber 140.

Service chamber 140 can be located anywhere in communication with deposition chamber 130. In an exemplary embodiment, service chamber 140 is located so as to be aligned with the middle of one end wall of deposition chamber 130. In an exemplary embodiment service chamber 140 is aligned with the wire feed to deposition apparatus 150. By aligning service chamber 140 with the wire feed to deposition apparatus 150, it is possible to move deposition apparatus 150 in and out of service chamber 140 without bending wire feed 160 or without requiring removal of wire feed 160. This provides the advantage of not affecting wire feed 160 nor to waste time removing and resetting wire feed 160 every time maintenance is done on deposition apparatus 150.

In exemplary embodiments, service chamber 140 allows for the passage of wire feed 160 through an opening 142 located at the distal end of service chamber 140 from deposition chamber 130. The opening 142 can be provided with means to prevent outside atmospheric gases from entering service chamber 140. Such means can be designed depending on the operating conditions of chamber system 100. In exemplary embodiments in which deposition chamber 130 is maintained under vacuum, the means can include sealing means, such as one or more sealing gaskets or membranes that allow the wire feed 160 to pass through while maintaining the vacuum conditions. In exemplary embodiments in which deposition chamber 130 is operated in an inert gas atmosphere, opening 142 can be equipped with an inert gas blower. The gas blower can continuously blow inert gas out the opening 142 thus helping to prevent influx of outside atmospheric gases. The blower can be any suitable blower and the amount of inert gas blown can be anywhere in an appropriate range that can help prevent the influx of outside atmospheric gases. In exemplary embodiments, the blower can blow at a flow rate of about 10 L/min. In alternative embodiments, the blower can blow at a flow rate higher than 10 L/min, for example 11 L/min, 13 L/min, 15 L/min, 20 L/min. In exemplary embodiments, the blower can blow at any flow rate that creates a pressure that is higher than the pressure outside the chamber so as to prevent any gasses from entering the chamber.

Service chamber 140 can also be equipped with appropriate means for conducting maintenance on the deposition apparatus 150. For example, as illustrated in FIG. 1, service chamber 140 can be equipped with a set of gloves 143 that allow an operator to work on the deposition apparatus 150 without opening service chamber 140. Thus, service can be provided without subjecting the service chamber 140 to atmospheric communication of the service chamber 140 to the exterior ambient environment. The set of gloves 143 allows service to be performed without opening the doors of the service chamber 140.

Service chamber 140 can also be equipped with one or more windows 146. Window 146 can allow an operator to view the deposition apparatus 150 without having to open service chamber 140. For example, an operator may use one or more window 146 to view deposition apparatus 150 while using gloves 143.

Service chamber 140 may also be equipped with an access portal 147. The portal may be integrated in the one or more windows 146. Alternatively, portal 147 can be provided separately from the one or more windows 146. Portal 147 can be designed to allow direct access to the deposition apparatus 150 so as to perform maintenance on deposition apparatus 150. For example, portal 147 may be used to replace parts on deposition apparatus 150. Portal 147 can be designed to allow for removal or installation of deposition apparatus 150. Like the previously discussed doors, portal 147 can be design to swing open or slide. Portal 147 can also comprise two panels that swing open. Portal 147 can be designed to form a gas impermeable seal when closed. The seal can be achieved using one or more seal members as described earlier for the use with doors. One or more pressure mechanisms, such as hinges and/or springs, may also be used to put pressure on portal 147 when closed so as to improve the seal. The pressure can be removed when portal 147 is opened. Portal 147 can also include a sensor that is able to detect when the portal 147 is open or closed. The sensor can be connected to the control system controlling deposition apparatus 150. In exemplary embodiments, if the sensor of portal 147 detects that portal 147 is opened during fabrication, the control system can send a signal to stop the fabrication process.

Deposition apparatus 150 can be transferred from deposition chamber 130 to service chamber 140 via a track system as described earlier with respect to the motion apparatus provided for the deposition apparatus 150 while inside deposition chamber 130. In exemplary embodiments, a track system on the ceiling of service chamber 140 is provided. Alternatively the track can be provided on a chamber wall or the bottom of service chamber 140. The track inside chamber 140 can be an extension of the track provided in deposition chamber 130 to which deposition apparatus 150 is connected while in deposition chamber 130. Alternatively, the track in chamber 140 can be a separate track that is able to engage deposition apparatus 150 when it enters service chamber 140. Deposition apparatus 150 can be pushed or pulled on the track inside service chamber 140 by the same motors, gears, wheels, pulley systems, and conveyors provided inside or outside deposition chamber 130. Alternatively, a motors, gears, wheels, pulley systems, and conveyors can be provided on deposition apparatus 150. Alternatively, separate motors, gears, wheels, pulley systems, and conveyors can be provided inside or outside service chamber 140. Alternatively, some of the motors, gears, wheels, pulley systems, and conveyors can be provided inside or outside service chamber 140 and some are provided on deposition apparatus 150.

Service chamber 140 can be in communication with deposition chamber 130 through opening 141. Opening 141 should preferably be sized so as to allow at least the deposition apparatus 150 to pass through. Opening 141 can be sealed from deposition chamber 130 using one or more doors as described earlier between deposition chamber 130 and loading/unloading chambers 110 and 120. The same type of door structure, materials, design and controls can be used here. In an alternative embodiment, instead of placing a door at opening 141, a door 144 with optional one or more sealing members 145 can be affixed onto deposition apparatus 150 at its distal end from service apparatus 140. In such exemplary embodiments, as shown in FIG. 2, door 144 may be arranged such that when the deposition apparatus 150 is transferred to service chamber 140, door 144 and optional one or more sealing members 145 seal opening 141. Thus, opening 141 is sealed by door 144 and one or more sealing members 145 automatically by transferring deposition chamber 150 into service chamber 140. An advantage of the illustrated embodiment of FIGS. 1 and 2, is that the ability of sealing opening 141 without having to worry about bending or having to remove wire feed 160. As illustrated in FIG. 1, this arrangement also provides that the service chamber 140 is in communication with deposition chamber 130 every time the deposition apparatus 150 is located inside deposition chamber 130.

Like the other chambers, service chamber 140 can also be provided with its own independent ventilation system that allows service chamber 140 to be under vacuum, in an inert gas or other gas atmosphere or in air. The same vents arrangement can be used as described above especially if the inert gas used is heavier than air, for example argon and/or argon-helium mixture. In exemplary embodiments, one or more vents used to introduce and/or evacuate a heavier gas or gas mixture are provided at a bottom portion of service chamber 140 while vents used to introduce and/or evacuate a lighter gas or gas mixture, for example air, are provided at an upper portion of service chamber 140.

Service chamber 140 can also be provided with its own independent temperature and pressure monitoring and control devices similar to those described for all other chambers. All doors, portals and openings of service chamber 140 can also be equipped with one or more sensors in a manner similar to the doors and openings in loading/unloading chambers 110 and 120 and deposition chamber 130 to detect if a door or opening is not properly sealed when it should be and to communicate that to one or more control systems of chamber system 100 which can then set off a visual and/or audible alarm, and which can stop or prevent from starting the solid free form fabrication. With respect to opening 142, one or more sensors can be used to monitor that the gas blower or other means to prevent outside atmospheric gases from entering service chamber 140 are properly functioning.

The following exemplary explanations are included for illustrative purposes only and is not intended to limit the scope of the embodiments provided herein.

USE OF LOADING/UNLOADING CHAMBERS

In an exemplary embodiment, deposition chamber 130 is prepared for solid free form manufacturing by setting the desired atmosphere. For example, air is evacuated from deposition chamber 130 and replaced by an inert gas or inert gas mixture such as argon or argon-helium mixture. The air is evacuated from deposition chamber 130 using a vacuum pump connected to a first set of one or more vents at the upper portion of deposition chamber 130. After activation of the vacuum pump, a control system is used to operate the valves connecting the vacuum to the first set of vents of deposition system 130. The control system may be manual, computerized or a combination thereof. The first set of vents can be located for example on the ceiling and/or at an upper portion of the chamber walls. By applying the vacuum, air is drawn out of deposition chamber 130 from the first set of vents located at the upper portion of deposition chamber 130. Simultaneous to the evacuation of air from deposition chamber 130, a control system, that can be the same or different from the control system operating the valves connecting the vacuum to the ventilation system of deposition chamber 130, is used to introduce an inert gas or inert gas mixture into deposition chamber 130. This latter control system may also be manual, computerized or a combination of both. The inert gas or inert gas mixture is introduced into deposition chamber 130 by way of a second set of one or more vents located at the bottom portion of deposition chamber 130, i.e. the floor and/or a bottom portion of the chamber walls. The inert gas or inert gas mixture includes at least one gas that is heavier than air. In this manner as the air is evacuated from the top of deposition chamber 130, inert gas or inert gas mixture is introduce from the bottom. The supply of inert gas or inert gas mixture can be provided by opening valves connected to a second set of vents of deposition chamber 130 that are separate from the first set of vents.

The supply of inert gas or inert gas mixture and evacuation of air in deposition chamber 130 is conducted such that the formation of dead pockets of air is minimized or eliminated. This process continues for a sufficient period of time until an oxygen detector present in deposition chamber 130 detects that the presence of oxygen is below 50 ppm. During this process, the pressure of deposition chamber is monitored using a pressure gauged and it is adjusted to be in the range of from about 3 to about 6 millibar above atmospheric pressure.

During the above process deposition chamber 130 is sealed off from any loading/unloading chamber and the outside atmosphere by one or more doors.

A holding substrate is loaded into a loading/unloading chamber 110 by opening door 111 of the loading/unloading chamber 100 that provides access to an operator and positioning the holding substrate over the conveyor 113 located inside loading/unloading chamber 110. Once the holding substrate is loaded into the loading/unloading chamber 110, the one or more access doors 111 can be closed so as to provide a gas impermeable seal. The atmosphere of the loading/unloading chamber is then replaced with one of inert gas or inert gas mixture. The process is similar to that described for the deposition chamber 130. A vacuum pump is connected to first set of one or more vents at the upper portion of the loading/unloading chamber to evacuate air from the chamber while a heavier than air inert gas or gas mixture is introduced from a second set of one or more vents located at the bottom of the loading/unloading chamber. The atmosphere of the loading/unloading chamber is made to be substantially the same as that of the deposition chamber measuring the conditions using the loading/unloading chamber's independent oxygen detector and pressure gauge.

Once the atmosphere of the loading/unloading chamber 110 is substantially similar to that of the deposition chamber 130, the one or more doors 112 sealing the loading/unloading chamber 110 from deposition chamber 130 are opened. The conveyor 113 inside loading/unloading chamber 110 is then operated to transfer the holding substrate onto the actuator 131 located inside deposition chamber 130 and positioned in proximity of the one or more doors 112 ready to receive the first holding substrate.

Once the transfer is accomplished, actuator 131 moves into the starting position for solid free form fabrication and the one or more doors 112 are closed. The solid free form fabrication process then commences inside deposition chamber 130. During fabrication, the inert atmosphere inside loading/unloading chamber 110 is maintained. During fabrication, recirculation system 200 of deposition chamber 130 can also be activated to chill the inert gas or gas mixture during free form fabrication to prevent overheating of deposition chamber 130 and/or of the equipment located inside deposition chamber 130.

Meanwhile a second holding substrate is loaded into loading/unloading chamber 120 by opening access door 121 and position the second holding substrate on conveyor 123. Access door 121 is then closed to provide a gas impermeable seal and the atmosphere inside is replaced with an inert atmosphere as described above for loading/unloading chamber 110.

Once the solid free form fabrication is completed using the first holding substrate so as to produce a first workpiece, the fabrication process stops and actuator 131 now holding the first workpiece moves back to a position proximate the one or more doors 112. The one or more doors 112 are opened again and the conveyor 113 retrieves the first workpiece from actuator 131. After the first workpiece is placed back on conveyor 113, the one or more doors 112 are sealed closed again.

After the first workpiece has been transferred to loading/unloading chamber 110 and the one or more doors 112 are closed, actuator 131 is moved to a position proximate the one or more doors 122. The one or more doors 122 then open and conveyor 123 transfers the second holding substrate onto actuator 131. Once the transfer has occurred, the one or more doors 122 seal closed, actuator 131 moves back in the starting position for solid free form fabrication and solid free form fabrication begins on the second holding substrate. During this fabrication process, the inert atmosphere in loading/unloading chamber 120 is maintained.

Meanwhile, the atmosphere in loading/unloading chamber 110 is replaced with air by applying a vacuum to the bottom set of one or more vents of loading/unloading chamber 110 and by introducing air through the upper set of one or more vents of loading/unloading chamber 110. Once the atmosphere in loading/unloading chamber 110 has been replaced with ambient air at atmospheric pressure, the one or more doors 111 are opened and the first workpiece is retrieved. In this manner, the operator retrieving the first workpiece is not exposed to the inert gas or inert gas mixture atmosphere that may be harmful to the operator. After unloading the first workpiece, the operator may load a third holding substrate onto conveyor 113. The one or more doors 111 are then closed and the atmosphere inside loading/unloading chamber 110 again replaced with inert atmosphere as done previously.

Once solid free form fabrication is completed on the second holding substrate to form a second workpiece, actuator 131 holding the second workpiece is moved back to a position proximate the one or more doors 122, which are then opened, and the conveyor 123 retrieves the second workpiece transferring it back into loading/unloading chamber 120 in a manner similar to what was done for transferring the first workpiece onto conveyor 113. The one or more doors 122 are then closed and actuator 131 is moved to be in a position proximate to one or more doors 112 ready to receive the third holding substrate in the same manner it received the first holding substrate.

Meanwhile, the atmosphere in loading/unloading chamber 120 is replaced with air in a similar manner as was done for loading/unloading chamber 110. The second workpiece is then retrieved from loading/unloading chamber 120 by accessing it via the one or more doors 121. A fourth holding substrate is then loaded onto conveyor 123.

The process above is repeated for as many workpieces that are to be produced. In the above manner, it is possible to expedite production process by not having to expend time waiting for the atmosphere in loading/unloading chamber to be replaced to transfer the holding substrate onto the actuator 131 as that process will have already been done by the time actuator 131 is ready to receive a new holding substrate, while also providing a way to quickly unload the previously formed workpiece.

During the above process, one or more sensors can be used to monitor the doors giving access to the deposition chamber during solid free form fabrication. If a door is not properly sealed shut or if a door is opened during the fabrication, the one or more sensors would send a signal reflecting that to the control system that controls the deposition apparatus and the solid free form fabrication process is either prevented from starting or if stopped if already started. In so doing, the solid free form fabrication is not exposed to an atmosphere other than what is intended.

USE OF SERVICE CHAMBER

In an exemplary embodiment, chamber system 100 may include service chamber 140 connected to deposition chamber 130. This may be in conjunction with also having one or more loading/unloading chambers also connected to deposition chamber 130. The operation of one or more loading/unloading chambers would be as described in the first example independent of whether a service chamber 140 is also used.

In an embodiment, the deposition apparatus 150 can be moved into service chamber 140. One or more doors 144 with one or more sealing members 145 can be provided at one end of deposition apparatus 150 so that as deposition apparatus enters service chamber 140, one or more doors 144 with one or more sealing members 145 are brought closer to opening 141. With this configuration, when deposition apparatus 150 is completely inside service chamber 140, one or more doors 144 and one or more sealing members 145 close opening 141 to create a gas impermeable seal between service chamber 140 and deposition chamber 130.

After deposition apparatus 150 is moved into service chamber 140, the atmosphere in deposition chamber 130 may be independently modified as desired in a similar manner as described in Example 1. If the atmosphere in deposition chamber 130 is already as desired, then deposition chamber 130 can simply be maintained.

The atmosphere in service chamber 140 can also be independently modified, if desired, once the deposition apparatus 150 is placed therein and opening 141 has been sealed. Replacement or adjustment of the atmosphere in service chamber 140 can be accomplished is manner similarly described above for the deposition chamber and/or the loading/unloading chambers. In other words, vents are located at the upper and lower portions of service chamber 140. Air or other light gas atmosphere may be introduced or evacuated from chamber 140 using one or more vents at the upper portion of service chamber 140. Likewise, heavy gas atmosphere may be introduced or removed using one or more vents at the bottom portion of service chamber 140. If service chamber 140 is to be used under vacuum conditions, a vacuum can also be applied to all upper and bottom vents simultaneously. Such can equally be done to any other chamber. Also, if vacuum conditions are desired, any subset of upper and bottom vents or combination of upper and bottom vents can be used independent of whether the atmosphere being evacuated. This also applies to the other chambers described herein, including deposition chamber 130 and loading/unloading chambers 110 and 120.

In an embodiment in which the service chamber 140 was already filled with an inert atmosphere, it may be desirable to simply maintain the atmosphere even after the deposition apparatus 150 has been transferred into chamber 140. If deposition apparatus 150 is in need of maintenance, an operator may perform such maintenance using gloves 143. The operator may view deposition apparatus 150 while performing the maintenance by looking through window 146.

If the required maintenance is not easily accomplished using gloves 143 or if the operator simply decides not to use gloves 143 to perform the maintenance, then the deposition apparatus can be accessed via portal 147. To avoid exposing the operator to potentially harmful gases, or if the service chamber 140 is under vacuum conditions when the deposition apparatus 150 is transferred therein, then the atmosphere inside service chamber 140 can be replaced with air at atmospheric pressure prior to opening portal 147.

Once maintenance is complete, portal 147 is closed (if it had been opened) and the atmospheric conditions of service chamber 140 is modified, if necessary, to be similar to those of deposition chamber 130. Once acceptable atmospheric conditions are achieved in service chamber 140, the deposition apparatus 150 is returned to deposition chamber 130. In this manner, the atmosphere in deposition chamber 130 is not substantially affected by unsealing opening 141.

As deposition apparatus 150 moves in and out of service chamber 140, wire feed 160 remains straight. As deposition apparatus 150 moves toward opening 141, and as it enters service chamber 140, a portion of wire feed 160 exits service chamber 140 by way of opening 142. As the deposition apparatus 150 enters deposition chamber 130, and moves deeper into deposition chamber 130, wire feed 160 enters service chamber 140 by way of opening 142. Additional wire feed 160 also enters service chamber 140 by way of opening 142 during solid free form fabrication as wire feed is used for the solid free form fabrication.

As described in Example 1, any portal or other door or opening of service chamber 140 can be monitored by one or more sensors. If one or more sensors detect that portal 147 or other door or portal, with the exception of opening 141 and opening 142, is not sealed as desired, or if it senses inflow of outside atmosphere from opening 142, a signal can be sent to the control system for the deposition apparatus in deposition chamber 130 to either prevent the start of a solid free form fabrication or to stop an on-going solid free form fabrication process. This avoids exposing the workpiece to an undesired atmosphere during manufacturing. Also, an audible alarm, visual alarm or combination thereof can be set off when one or more sensors signal a leak, lack of seal or opening in service chamber 140.

Likewise, one or more sensors may be used to monitor the sealing of opening 141 when deposition apparatus 150 is in service chamber 140. An audible alarm, visual alarm or combination thereof can be set off if the one or more sensors detect that opening 141 is not properly sealed so that an operator is alerted that modifying the atmosphere in service chamber 140 can affect the atmosphere of deposition chamber 130.

It will be apparent to those skilled in the art that various modifications and variation can be made in the present invention without departing from the scope of the invention. Thus, it is intended that the present invention cover the modifications and variations of this invention provided they come within the scope of the appended claims and their equivalents.

What is claimed is:

1. A chamber system for solid free form fabrication comprising:
    one or more independently controlled loading/unloading chambers;
    an independently controlled deposition chamber, the deposition chamber including a deposition apparatus comprising a heat source;
    one or more doors connecting the deposition chamber with each of one or more loading/unloading chambers; and
    an independently controlled service chamber connected to the deposition chamber, the service chamber sized to house the deposition apparatus, and arranged such that the deposition apparatus can move in and out of the service chamber without removing a wire feed to the deposition apparatus.

2. The chamber system of claim 1, wherein each of the one or more loading/unloading chambers further comprises:
    one or more doors providing access to the loading/unloading chamber;

a conveyor located inside the loading/unloading chamber; and one or more vents.

3. The chamber system of claim 2, each loading/unloading chamber comprising a vent located at an upper portion of the loading/unloading chamber and a vent located at a bottom portion of the loading/unloading chamber; the vent located at the upper portion being operatively connected to a vacuum pump and to an air supply; and the vent located at the bottom portion being operatively connected to a vacuum pump and to a source of inert gas or inert gas mixture.

4. The chamber system of claim 1, further comprising two loading/unloading chambers with a wall in common between them, and wherein each loading/unloading chamber also has a wall in common with the deposition chamber.

5. The chamber system of claim 1, the deposition chamber further comprising one or more vents located at an upper portion of the deposition chamber and one or more vents located at a bottom portion of the deposition chamber; the one or more vents located at the upper portion being operatively connected to a vacuum pump and to an air supply; and the one or more vents located at the bottom portion being operatively connected to a vacuum pump and to a source of inert gas or inert gas mixture.

6. The chamber system of claim 1, the deposition chamber further comprising one or more viewing portals.

7. The chamber system of claim 1, the deposition chamber further comprising a recirculation system comprising a fan and a heat exchanger.

8. The chamber system of claim 1, the service chamber further comprising one or more vents at an upper portion of the service chamber and one or more vents at a bottom portion of the service chamber; the one or more vents located at the upper portion being operatively connected to a vacuum pump and to an air supply;

the one or more vents located at the bottom portion being operatively connected to a vacuum pump and to a source of inert gas or inert gas mixture.

9. The chamber system of claim 1, the service chamber further comprising an access portal.

10. The chamber system of claim 1, the service chamber further comprising a set of gloves.

11. The chamber system of claim 1, wherein the deposition apparatus is configured to move relative to a holding substrate that is kept at a fixed location.

12. The chamber system of claim 1, further comprising an actuator for holding a base material, wherein the actuator and deposition apparatus are configured to generate a displacement relative to each other by:

a motion of the deposition apparatus while the actuator remains at a fixed position, a motion of the actuator while the deposition apparatus remains at a fixed position, or a motion of the deposition apparatus and of the actuator.

13. A method of operating a chamber system for solid free form fabrication comprising:

independently replacing the atmosphere in a deposition chamber of the chamber system with an inert atmosphere;

transferring a first holding substrate to the deposition chamber while maintaining the inert atmosphere in the deposition chamber;

performing solid free form fabrication using a deposition apparatus comprising a heat source within the deposition chamber to form a first workpiece; and transferring the first workpiece out of the deposition chamber while maintaining the inert atmosphere in the deposition chamber, wherein the chamber system comprises the deposition chamber and a service chamber sized to house the deposition apparatus and being arranged such that the deposition apparatus moves in and out of the service chamber without requiring removal of a wire feed to the deposition apparatus.

14. The method of claim 13, wherein the chamber system further comprises one or more loading/unloading chambers, the one or more loading/unloading chambers and the service chamber being in communication with the deposition chamber through one or more independent openings, further comprising controlling each of the deposition chamber, one or more loading/unloading chambers, and the service chamber independently.

15. The method of claim 14, wherein the chamber system further comprises one or more doors to seal the one or more independent openings, further comprising monitoring the one or more doors at each of the deposition chamber, one or more loading/unloading chambers, and the service chamber using one or more sensors.

16. The method of claim 15, further comprising stopping the solid free form fabrication if one or more sensors detects that at least one of the one or more doors is not properly sealed closed.

17. The method of claim 13, wherein the chamber system further comprises one or more loading/unloading chambers, the one or more loading/unloading chambers and the service chamber being in communication with the deposition chamber through one or more independent openings, further comprising:

loading a first holding substrate on a conveyor located inside a first loading/unloading chamber;

replacing the atmosphere in the first loading/unloading chamber with the same inert atmosphere as in the deposition chamber; and maintaining the atmosphere inside the first loading/unloading chamber during transfer of the holding substrate to the deposition chamber and during solid free form fabrication.

18. The method of claim 17, further comprising:

loading a second holding substrate onto a conveyor of a second loading/unloading chamber while maintaining the inert atmosphere in the first loading/unloading chamber;

replacing the atmosphere of the second loading/unloading chamber with the same inert atmosphere as in the deposition chamber.

19. The method of claim 18, wherein transferring the first workpiece out of the deposition chamber comprises:

transferring the workpiece into the first loading/unloading chamber while maintaining the inert atmosphere in the first loading/unloading chamber;

sealing the first loading/unloading chamber from the deposition chamber;

replacing the inert atmosphere in the first loading/unloading chamber with ambient air; and unloading the workpiece from the loading/unloading chamber.

20. The method of claim 19 further comprising:

after sealing the first loading/unloading chamber from the deposition chamber, transferring a second holding substrate from a second loading/unloading chamber to the deposition chamber while maintaining the inert atmosphere in the deposition chamber.

21. The method of claim 13, wherein performing solid free form fabrication using a deposition apparatus comprises:
- moving the deposition apparatus while the holding substrate is at a fixed position,
- moving the holding substrate while the deposition apparatus is at a fixed position, or
- moving the deposition apparatus and the holding substrate.

* * * * *